(12) United States Patent
Chen et al.

(10) Patent No.: US 8,564,020 B2
(45) Date of Patent: Oct. 22, 2013

(54) TRANSISTORS AND RECTIFIERS UTILIZING HYBRID ELECTRODES AND METHODS OF FABRICATING THE SAME

(75) Inventors: Jing Chen, Hong Kong (CN); Chunhua Zhou, Hong Kong (CN)

(73) Assignee: The Hong Kong University of Science and Technology, Kowloon (HK)

( * ) Notice: Subject to any disclaimer, the term of this patent is extended or adjusted under 35 U.S.C. 154(b) by 241 days.

(21) Appl. No.: 12/843,313

(22) Filed: Jul. 26, 2010

(65) Prior Publication Data

US 2011/0018002 A1 Jan. 27, 2011

Related U.S. Application Data

(60) Provisional application No. 61/213,895, filed on Jul. 27, 2009, provisional application No. 61/348,976, filed on May 27, 2010.

(51) Int. Cl.
*H01L 29/66* (2006.01)

(52) U.S. Cl.
USPC 257/194; 257/76; 257/E21.403; 257/E29.246; 257/E29.091; 438/172

(58) Field of Classification Search
USPC .................. 257/76, 194, E21.403, E29.246, 257/E29.091; 438/172
See application file for complete search history.

(56) References Cited

U.S. PATENT DOCUMENTS

| 6,093,952 A | 7/2000 | Bandic et al. |
| 7,459,356 B1 | 12/2008 | Smart et al. |
| 2001/0034116 A1 | 10/2001 | Lee et al. |
| 2007/0145390 A1 | 6/2007 | Kuraguchi |
| 2007/0278518 A1 | 12/2007 | Chen et al. |
| 2007/0295993 A1* | 12/2007 | Chen et al. ............. 257/194 |
| 2009/0189190 A1 | 7/2009 | Hashimoto et al. |
| 2011/0121314 A1* | 5/2011 | Suh et al. ............. 257/76 |

FOREIGN PATENT DOCUMENTS

| CN | 101359686 A | 2/2009 |
| CN | 101562182 A | 10/2009 |

OTHER PUBLICATIONS

Bahat-Treidel et al., "Punchthrough-Voltage Enhancement of AlGaN/GaN HEMTs Using AlGaN Double-Heterojunction Confinement" IEEE Trans. Electron. Devices 55, 3354 (2008).
Choi et al., "The Effect of an Fe-doped GaN Buffer on off-State Breakdown Characteristics in AlGaN/GaN HEMTs on Si Substrate" IEEE Trans. Electron. Devices 53, 2926 (2006).
Huang et al. "Monolithic High-Voltage GaN MOSFET/Schottky Pair with Reverse Blocking Capability" ISPSD, 265 (2007).
Bahat-Treidel et al., "AlGaN/GaN HEMT With Integrated Recessed Schottky-Drain Protection Diode" IEEE Electron. Device Lett. 30, 901 (2009).

(Continued)

*Primary Examiner* — Eugene Lee
*Assistant Examiner* — Elias M Ullah
(74) *Attorney, Agent, or Firm* — Turocy & Watson, LLP

(57) ABSTRACT

Systems, methods, and apparatus described herein are associated with devices including hybrid electrodes. A heterostructure semiconductor transistor can include a III-N-type semiconductor heterostructure including a barrier layer overlying an active layer and a hybrid electrode region including a hybrid drain electrode region. Further, a heterostructure semiconductor rectifier can include a III-N-type semiconductor heterostructure and a hybrid electrode region including a hybrid cathode electrode region. Furthermore, the hybrid electrode region of the transistor and rectifier can include permanently trapped charge located under a Schottky contact of the hybrid electrode region.

28 Claims, 24 Drawing Sheets

(56) References Cited

OTHER PUBLICATIONS

Sanchez et al. "Design and fabrication of new high voltage current limiting devices for serial protection applications" ISPSD, 201 (1996).

Godignon et al. "Current limiting power device based on a 4 layer structure" IEEE Industry Applications Conference, 1236 (1997).

Tournier et al. "A 4H-SiC high-power-density VJFET as controlled current limiter" IEEE Trans. Industry Applications 39, 1508 (2003).

Chow et al. "Wide bandgap compound semiconductors for superior high-voltage unipolar power devices", IEEE Trans. on Electron. Devices, vol. 41, No. 8, pp. 1481-1483 (1994).

Uemoto et al. "8300V Blocking Voltage AlGaN/GaN Power HFET with Thick Poly-AlN Passivation" IEDM Technical Digest, Washington DC, pp. 861-864, 2007.

Ha et al "New GaN Schottky barrier diode employing a trench on AlGaN/GaN heterostructure" Superlattices and Microstructures 40 (2006) pp. 567-573.

Chen et al. "High-performance AlGaN/GaN lateral field-effect rectifiers compatible with high electron mobility transistors" Applied Physics Letters 92, 253501 (2008).

Chen et al. "Monolithic Integration of Lateral Field-Effect Rectifier with Normally-off HEMT for GaN-on-Si Switch-mode Power Supply Converters" Electron Devices Meeting, 2008. IEDM (2008).

Chen et al. "Single-Chip Boost Converter Using Monolithically Integrated AlGaN/GaN Lateral Field-Effect Rectifier and Normally Off HEMT", IEEE Electron Device Letters, vol. 30, No. 5, May 2009.

Uren et al. "Punch-Through in Short-Channel AlGaN/GaN HFETs" IEEE Transactions on Electron Devices, vol. 53, No. 2, Feb. 2006.

Cai et al. "Control of Threshold Voltage of AlGaN/GaN HEMTs by Fluoride-Based Plasma Treatment: From Depletion Mode to Enhancement Mode" IEEE Transactions on Electron Devices, vol. 53, No. 9, Sep. 2006.

Wong et al. "Wide Bandgap GaN Smart Power Chip Technology", CS Mantech Conference, May 18-21, 2009, Tampa, Florida, USA.

Wang et al. "Source Injection Induced Off-State Breakdown and Its Improvement by Enhanced Back Barrier with Fluorine Ion Implantation in AlGaN/GaN HEMTs" Electron Devices Meeting, 2008. IEDM 2008.

Zhou et al. "AlGaN/GaN lateral field-effect rectifier with intrinsic forward current limiting capability" Electron. Lett.—Mar. 18, 2010—vol. 46, Issue 6, p. 445-447.

Zhou et al. "AlGaN/GaN Dual-Channel Lateral Field-Effect Rectifier With Punchthrough Breakdown Immunity and Low On-Resistance" IEEE Electron Device Letters, vol. 31, No. 1, Jan. 2010.

Zhou et al. "Self-Protected GaN Power Devices with Reverse Conduction Blocking and Forward Current Limiting Capabilities" 2009.

Zhou et al. "AlGaN/GaN Normally-Off HEMT with Schottky Contact Controlled Reverse Blocking Drain", Manuscript for IEEE Electron Device Letters 2009.

Zhou et al. "AlGaN/GaN Dual-Channel Lateral Field-Effect Rectifier with Punchthrough Breakdown Immunity and Low On-Resistance" CS Mantech Conference, May 17-20, 2010, Portland, Oregon, USA.

\* cited by examiner

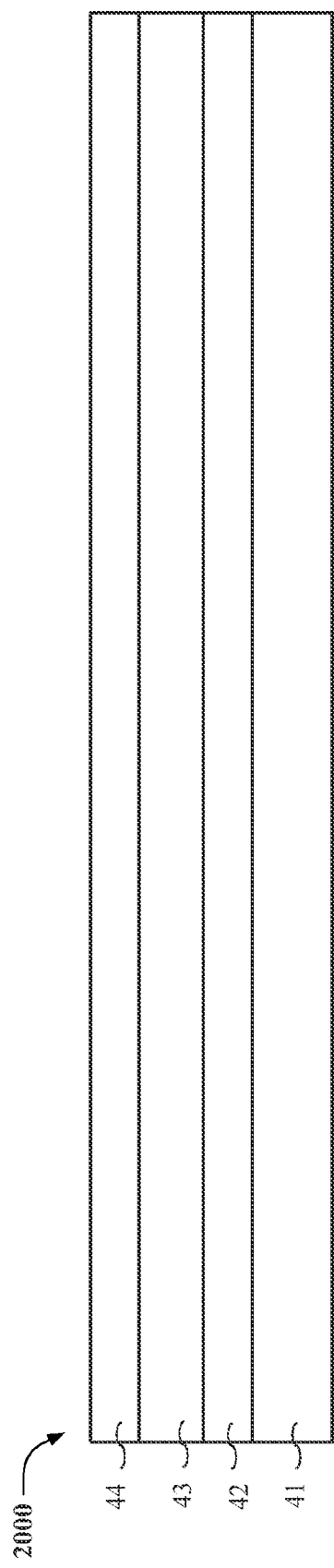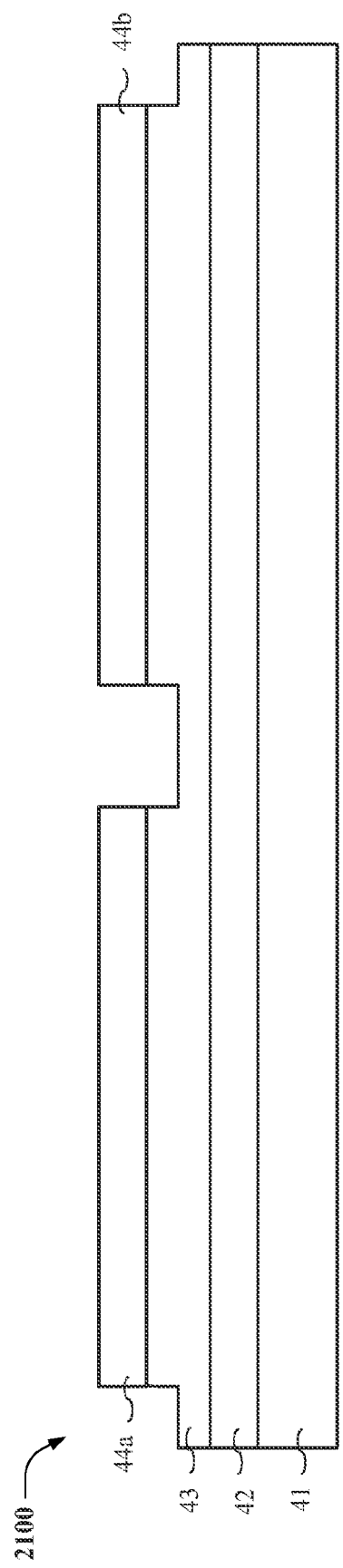

TRANSISTORS AND RECTIFIERS UTILIZING HYBRID ELECTRODES AND METHODS OF FABRICATING THE SAME

PRIORITY CLAIM

This application claims priority to U.S. Provisional Patent Application Ser. No. 61/213,895, filed on Jul. 27, 2009, entitled "AlGaN/GaN DUAL-CHANNEL LATERAL FIELD-EFFECT RECTIFIER WITH PUNCH-THROUGH BREAKDOWN IMMUNITY AND LOW ON-RESISTANCE"; and U.S. Provisional Patent Application Ser. No. 61/348,976, filed on May 27, 2010, entitled "AlGaN/GaN DUAL-CHANNEL LATERAL FIELD-EFFECT RECTIFIER WITH PUNCH-THROUGH BREAKDOWN IMMUNITY AND LOW ON-RESISTANCE." The entirety of the aforementioned applications is incorporated by reference herein.

TECHNICAL FIELD

This disclosure relates generally to III-N-type power devices and fabricating methods including, but not limited to, III-N-type semiconductor transistors and rectifiers having hybrid electrodes and related manufacturing methods.

BACKGROUND

Group III-nitride ("III-N") compound semiconductor materials, including GaN, advantageously possess a wide band gap (or bandgap), a high breakdown voltage, and a large thermal conductivity under very high power levels (100 kW to 1 MW) and temperatures exceeding 250° C. without requiring liquid cooling. In addition, a wide-bandgap heterostructure system, e.g., incorporating a AlGaN/GaN heterostructure enhanced by spontaneous and piezoelectric polarization effects, yields a two-dimensional electron gas (2DEG) channel with a high sheet charge concentration and high electron mobility (associated with high current density). As such, Group III-nitride semiconductor materials, e.g., the heterostructure system, are favored candidates for fabricating power semiconductor devices.

Power semiconductor devices include two categories: 1) transistors (used as switches) and 2) rectifiers (converting alternating current (AC) to direct current (DC)). Transistors and rectifiers are essential components in high voltage power electronics applications including, e.g., switching-mode power supplies, power converters, high current/voltage driving circuits, power factor correction circuits, etc. As such, low on-resistance ($R_{ON}$) and high off-state breakdown voltage (BV) are desirable transistor/rectifier features.

Conventional AlGaN/GaN high electron mobility transistors (HEMTs) and lateral field-effect rectifiers (L-FERs) cannot simultaneously achieve high BV (or channel punch-through immunity) and low $R_{ON}$ because improving channel punch-through immunity of such devices, i.e., by increasing Schottky contact length (>1 μm), increases $R_{ON}$. Further, operation of a conventional enhancement/depletion mode HEMT can fail due to high current flow caused (1) when a drain electrode of the HEMT is negatively biased, i.e., during an accidental reverse battery connection in an electric vehicle application, during a switch-mode Class-S amplifier application resulting in fly-back, etc; and/or (2) when a gate electrode of the HEMT experiences a high positive DC or pulse voltage. Furthermore, operation of a conventional rectifier, i.e., a Schottky barrier diode (SBD), an L-FER, etc. can fail due to an increase in the forward bias voltage at the anode of the rectifier, which can increase on-state current that can lead to device failure.

The above-described deficiencies of today's power semiconductor devices and related technologies are merely intended to provide an overview of some of the problems of conventional technology, and are not intended to be exhaustive. Other problems with the state of the art, and corresponding benefits of some of the various non-limiting embodiments described herein, may become further apparent upon review of the following detailed description.

SUMMARY

The following presents a simplified summary to provide a basic understanding of some aspects described herein. This summary is not an extensive overview of the disclosed subject matter. It is not intended to identify key or critical elements of the disclosed subject matter, or delineate the scope of the subject disclosure. Its sole purpose is to present some concepts of the disclosed subject matter in a simplified form as a prelude to the more detailed description presented later.

To correct for the above identified deficiencies of today's power semiconductor techniques and other drawbacks of conventional power semiconductor technologies, various systems, methods, and apparatus described herein provide for/include devices with hybrid electrodes, which are able to simultaneously provide channel punch-through immunity and low-on resistance, e.g., associated with III-N semiconductor material or the like. Further, such devices can provide reverse current blocking capability when a drain electrode, e.g., of a HEMT, is negatively biased; and can protect a gate electrode, e.g., of the HEMT, which is positively biased with a high voltage. Furthermore, such devices can provide forward on-state current limiting functions, e.g., of a rectifier.

For example, an enhancement-mode (E-mode) HEMT, e.g., implemented in a III-N-type semiconductor heterostructure including a barrier layer overlying an active/channel layer, can include a hybrid gate electrode that can simultaneously provide channel punch-through breakdown immunity and low on-resistance. In an aspect, a bandgap of the barrier layer can be different from a bandgap of the active/channel layer. In another aspect, the active/channel layer can include GaN. The hybrid gate electrode can include a first Schottky (barrier) contact to the III-N-type semiconductor heterostructure—located towards a source electrode side of the E-mode HEMT; and a second Schottky (barrier) contact to the III-N-type semiconductor heterostructure—located towards a drain electrode side of the E-mode HEMT.

The source electrode and the drain electrode can make ohmic contact to respective portions of the III-N-type semiconductor heterostructure. Furthermore, the first Schottky contact can be electrically coupled, connected, shorted, etc. to the second Schottky contact. Moreover, fixed charges can be incorporated under the first Schottky contact, e.g., via negatively charged fluorine ions ($F^-$) introduced by fluoride-based (e.g. $CF_4$) plasma ion implantation or by fluorine ion implantation.

In another example, an E-mode HEMT, e.g., implemented in a III-N-type semiconductor heterostructure including a barrier layer overlying an active/channel layer, can include a hybrid drain electrode that can provide reverse blocking capability when a drain of the E-mode HEMT is biased with a negative voltage. In an aspect, a bandgap of the barrier layer can be different from a bandgap of the active/channel layer. Further, the hybrid drain electrode can include a first Schottky (barrier) contact to the III-N-type semiconductor heterostructure—located towards a gate electrode side of the E-mode HEMT.

The gate electrode can include a second Schottky (barrier) contact to respective portions of the III-N-type semiconductor. Furthermore, the hybrid drain electrode can include an ohmic (barrier) contact to the III-N-type semiconductor heterostructure—located away from the gate electrode side of the E-mode HEMT. Moreover, the ohmic contact can be electrically coupled, connected, shorted, etc, e.g., in series, with the first Schottky contact. In addition, fixed charges can be incorporated under the first Schottky contact and the second Schottky contact, e.g., via negatively charged fluorine ions ($F^-$) introduced by fluoride-based (e.g. $CF_4$) plasma ion implantation or by fluorine ion implantation.

In yet another example, an E-mode HEMT, e.g., implemented in a III-N-type semiconductor heterostructure including a barrier layer overlying an active/channel layer, can include the hybrid drain electrode (see above) and a hybrid source electrode that can provide reverse blocking capability when the drain of the E-mode HEMT is biased with a negative voltage, and gate protection when a gate electrode of the E-mode HEMT is biased with a positive voltage. In an aspect, a bandgap of the barrier layer can be different from a bandgap of the active/channel layer.

Further, the hybrid source electrode can include a first Schottky (barrier) contact to the III-N-type semiconductor heterostructure—located towards a gate electrode side of the E-mode HEMT; and an ohmic (barrier) contact to the III-N-type semiconductor heterostructure—located away from the gate electrode side of the E-mode HEMT. Furthermore, the ohmic contact can be electrically coupled, connected, shorted, etc, e.g., in series, with the first Schottky contact. In addition, the gate electrode can include a second Schottky (barrier) contact to respective portions of the III-N-type semiconductor. In an aspect, fixed charges can be incorporated under the first Schottky contact and the second Schottky contact, e.g., via negatively charged fluorine ions ($F^-$) introduced by fluoride-based (e.g. $CF_4$) plasma ion implantation or by fluorine ion implantation.

In one example, an E-mode HEMT, e.g., implemented in a III-N-type semiconductor heterostructure including a barrier layer overlying an active/channel layer, can include various combinations of the hybrid gate electrode, the hybrid drain electrode, and the hybrid source electrode (all described above).

In another example, a depletion-mode (D-mode) HEMT, e.g., implemented in the III-N-type semiconductor heterostructure, can include the hybrid drain electrode, e.g., described above—the D-mode HEMT differing in function from the E-mode HEMT by providing reverse blocking capability when the hybrid drain electrode is biased with a negative voltage.

In yet another example, a D-mode HEMT, e.g., implemented in the III-N-type semiconductor heterostructure, can include the hybrid drain electrode and the hybrid source electrode, e.g., described above—the D-mode HEMT differing in function from the E-mode HEMT by providing reverse blocking capability when the hybrid drain electrode is biased with a negative voltage and gate protection when a gate of the D-mode HEMT is biased with a positive voltage.

In one example, a D-mode HEMT, e.g., implemented in a III-N-type semiconductor heterostructure including a barrier layer overlying an active/channel layer, can include various combinations of the hybrid gate electrode, the hybrid drain electrode, and the hybrid source electrode.

In another example, a lateral field-effect rectifier (L-FER), e.g., implemented in a III-N-type semiconductor heterostructure including a barrier layer overlying an active/channel layer, can include a hybrid anode electrode that can simultaneously provide channel punch-through breakdown immunity and low on-resistance. In an aspect, a bandgap of the barrier layer can be different from a bandgap of the active/channel layer. Further, the hybrid anode electrode can include a first ohmic contact to the III-N-type semiconductor heterostructure—located away from a cathode electrode side of the L-FER; a first Schottky (barrier) contact to the III-N-type semiconductor heterostructure—located, e.g., adjacent, to the first ohmic contact; and a second Schottky (barrier) contact to the III-N-type semiconductor heterostructure—located, e.g., adjacent, to the first Schottky contact and towards the cathode electrode side of the L-FER.

The cathode electrode can make ohmic contact to respective portion(s) of the III-N-type semiconductor heterostructure. Furthermore, the first ohmic contact, the first Schottky contact, and the second Schottky contact can be electrically coupled, connected, shorted, etc., e.g., in series. Moreover, fixed charges can be incorporated under the first Schottky contact and the second Schottky contact, e.g., via negatively charged fluorine ions ($F^-$) introduced by fluoride-based (e.g. $CF_4$) plasma ion implantation or by fluorine ion implantation.

In yet another example, an L-FER, e.g., implemented in a III-N-type semiconductor heterostructure including a barrier layer overlying an active/channel layer, can include a hybrid cathode electrode that can limit on-state current of the L-FER when the L-FER is forward biased. In an aspect, a bandgap of the barrier layer can be different from a bandgap of the active/channel layer. Further, the L-FER can include an anode electrode including a first ohmic contact to the III-N-type semiconductor heterostructure—located away from the hybrid cathode electrode side of the L-FER; and a first Schottky contact to the III-N-type semiconductor heterostructure—located towards the hybrid cathode electrode side of the L-FER. Furthermore, the first ohmic contact and the first Schottky contact can be electrically coupled, connected, shorted, etc., e.g., in series.

Moreover, the hybrid cathode electrode can include a second ohmic contact to the III-N-type semiconductor heterostructure—located away from the anode electrode side of the L-FER; and a second Schottky contact to the III-N-type semiconductor heterostructure—located towards the anode electrode side of the L-FER. Moreover, the second ohmic contact and the second Schottky contact can be electrically coupled, connected, shorted, etc, e.g., in series. In addition, charge can be trapped under the first Schottky contact, e.g., via negatively charged fluorine ions ($F^-$) introduced by $CF_4$ plasma treatment or by ion implantation.

In yet another example, an L-FER, e.g., implemented in a III-N-type semiconductor heterostructure including a barrier layer overlying an active/channel layer, can include a hybrid anode electrode and a hybrid cathode electrode (all described above).

In one example, a Schottky barrier diode (SBD) can include the hybrid cathode electrode (described above) to provide a forward biased on-state current limiting function.

In another example, a method for manufacturing the hybrid electrode transistors and rectifiers can include forming a III-N-type heterostructure ("the structure") including a barrier layer and an active layer—the barrier layer and the active layer having different bandgaps; forming one or more isolation structures to at least partly separate the structure into structure regions; fabricating ohmic contact(s) to the structure; fabricating a first Schottky barrier contact to the structure, the first Schottky barrier contact including: a permanently negative charge-trapped region located directly under the first Schottky contact, and fabricating a second Schottky barrier contact to the structure.

The following description and the annexed drawings set forth in detail certain illustrative aspects of the disclosed subject matter. These aspects are indicative, however, of but a few of the various ways in which the principles of the innovation may be employed. The disclosed subject matter is intended to include all such aspects and their equivalents. Other advantages and distinctive features of the disclosed subject matter will become apparent from the following detailed description of the innovation when considered in conjunction with the drawings.

BRIEF DESCRIPTION OF THE DRAWINGS

Non-limiting and non-exhaustive embodiments of the subject disclosure are described with reference to the following figures, wherein like reference numerals refer to like parts throughout the various views unless otherwise specified.

FIGS. 20-26 illustrate a method for fabricating an E-mode HEMT including hybrid electrode(s) and an L-FER including hybrid electrode(s), in accordance with an embodiment.

DETAILED DESCRIPTION

Figure 1:
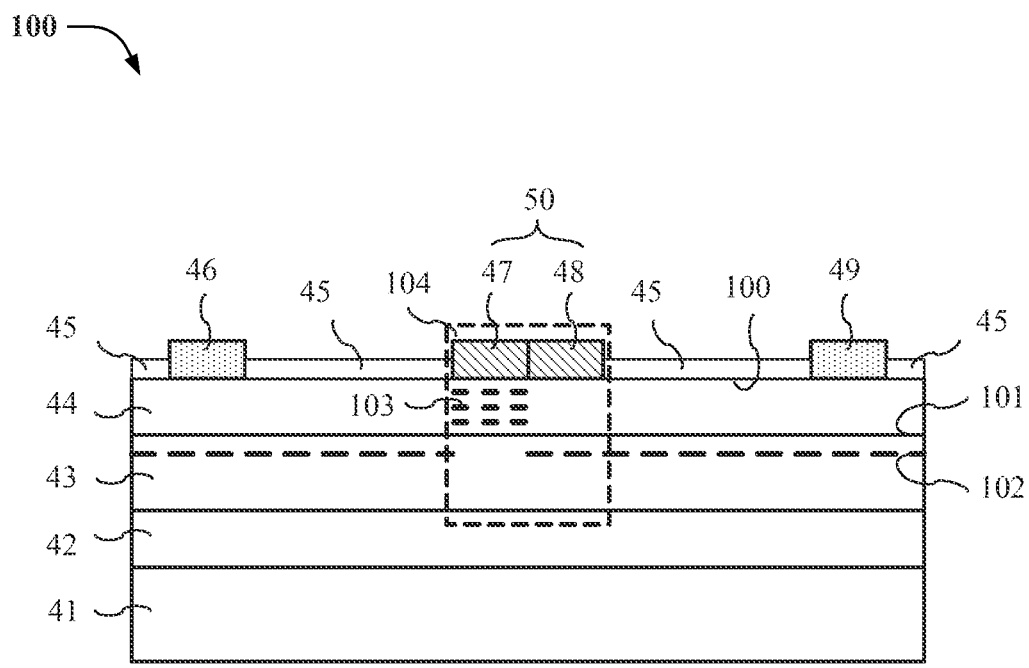
FIG. 1 illustrates a schematic cross-section of an E-mode HEMT including a hybrid gate electrode, in accordance with an embodiment.

Various non-limiting embodiments of systems, methods, and apparatus presented herein provide for electronic devices that can operate (1) at high power levels; (2) at high temperatures; and (3) in noisy environments with enhanced performance via, e.g., power converters; motor drive circuits; audio amplifiers; interfaces associated with combustion engines, aerospace applications, electronics associated with oil and gas well-logging, etc.

In the following description, numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

For simplicity and clarity of illustration, some of the figures illustrate the general manner of construction of embodiments of semiconductor devices described herein. Further, description and details of well-known features and techniques of constructing such devices are omitted to avoid unnecessarily obscuring aspects of the innovation. Additionally, elements in the figures are not necessarily drawn to scale, and some regions or elements of the figures may be expanded to help improve understanding of embodiments of the invention.

The terms "first," "second," "third," "fourth," and the like may be used for distinguishing between similar elements and not necessarily for describing a particular sequential or chronological order. Furthermore, the terms "comprise," "include," "have," and any variations thereof, are intended to cover non-exclusive inclusions, such that a process, method, article, apparatus, or composition that comprises a list of elements is not necessarily limited to those elements, but may include other elements not expressly listed or inherent to such process, method, article, apparatus, or composition.

Further, it should be appreciated that aspects of the innovation can be applied to other 2DEG-type field-effect transistors and/or rectifiers. As such, the examples described herein are based on a single $Al_xGa_{1-x}N$/GaN vertical layered heterostructure for clarity; however, those of ordinary skill in the art should appreciate that variations can be made to various aspects described herein to modify such aspects, e.g., to make other combinations and/or forms of such aspects, e.g., utilizing horizontal layers in a semiconductor process to provide various embodiments described herein.

Reference throughout this specification to "one embodiment," or "an embodiment," means that a particular feature, structure, or characteristic described in connection with the embodiment is included in at least one embodiment. Thus, the appearances of the phrase "in one embodiment," or "in an embodiment," in various places throughout this specification are not necessarily all referring to the same embodiment. Furthermore, the particular features, structures, or characteristics may be combined in any suitable manner in one or more embodiments.

Referring now to FIG. 1, a schematic cross-section of an E-mode HEMT 100 including a hybrid gate electrode 50 and utilizing nitride semiconductor material is illustrated, in accordance with an embodiment. In an aspect, the nitride semiconductor material can include a III-N-type semiconductor including metal nitrides and more than one Group III material. In another aspect, the III-N-type semiconductor can include GaN and/or related ternary semiconductor materials. In yet another aspect, an active/channel layer (see above) can overlie a III-N buffer layer, e.g., which can overlie a III-N nucleation layer.

As illustrated by FIG. 1, nitride material buffer layer 42 can be formed on substrate layer 41, and substrate layer 41 can include Si, SiC, Sapphire, and/or GaN. In one aspect, nitride semiconductor channel layer 43, e.g., including GaN, can be formed on buffer layer 42. In another aspect, nitride semiconductor barrier layer 44, e.g., $Al_xGa_{1-x}N$ ($0<x\leq1$), can be formed on semiconductor layer 43, and can include AlGaN, and/or AlGaN capped by GaN. In yet another aspect, nitride semiconductor barrier layer 44 can be undoped. In an aspect, passivation (or protection) layer 45 can be formed on semiconductor layer 44. In another aspect, passivation layer 45 can include at least one of silicon nitride, silicon oxide, Benzocyclobutene, or polyimide.

A polarization charge can be generated by spontaneous and piezoelectric polarization of nitride semiconductor material, at an interface 101 at a boundary between semiconductor layer 43 and semiconductor layer 44. As a result of the polarization charge, a two dimensional electron gas (2DEG) 102 can form in the vicinity between semiconductor 43 and semiconductor layer 44. Further, hybrid gate electrode 50 can be formed by electrically shorting Schottky contact electrode 47 and Schottky contact electrode 48. Furthermore, a source ohmic contact, a drain ohmic contact, and a hybrid gate electrode can be formed on primary surface 100 of semiconductor layer 44.

Ohmic contact electrodes described herein can be formed to semiconductor layer 44 (and hence underlying 2DEG 102), e.g., by a metal stack including Ti/Al/Ni/Au (not shown), for example, via thermal annealing. Schottky contact electrodes described herein can be formed to the underlying semiconductor layer 44, e.g., by a metal stack Ni/Au (not shown), for example, via thermal annealing. Region 103 can be included in semiconductor barrier layer 44, underneath Schottky contact electrode 47, and can include permanently negatively charged ions, e.g., fluorine ions (F−), which can be introduced by at least one of a $CF_4$ plasma treatment, an $SF_6$ plasma treatment, a $BF_3$ plasma treatment, or ion implantation.

Further, region 103 can also extend into semiconductor (channel) layer 43. Under Schottky contact electrode 47, 2DEG 102 is depleted by negatively charged region 103, providing E-mode HEMT 100 with E-mode operation and forming a normally-off channel section. Furthermore, 2DEG 102 can exist under Schottky contact electrode 48, forming a normally-on channel section. Moreover, a hybrid gate electrode region 104 can be formed, including a normally-off channel section under Schottky contact electrode 47 and a normally-on channel section under Schottky contact electrode 48.

With zero biased gate-source voltage, the normally-off channel section blocks, restricts, etc. drain current when a drain electrode, e.g., 49, is biased under low positive voltage. Further, the normally-on channel section gets pinched off when the drain electrode is biased under high positive voltage, which prevents the normally-off channel section from being punched through. Furthermore, the normally-on channel section includes much higher carrier density during an on-state, forward-bias mode of E-mode HEMT 100. As such, hybrid gate electrode 50 can simultaneously provide punch-through breakdown immunity and low on-resistance.

Figure 2:
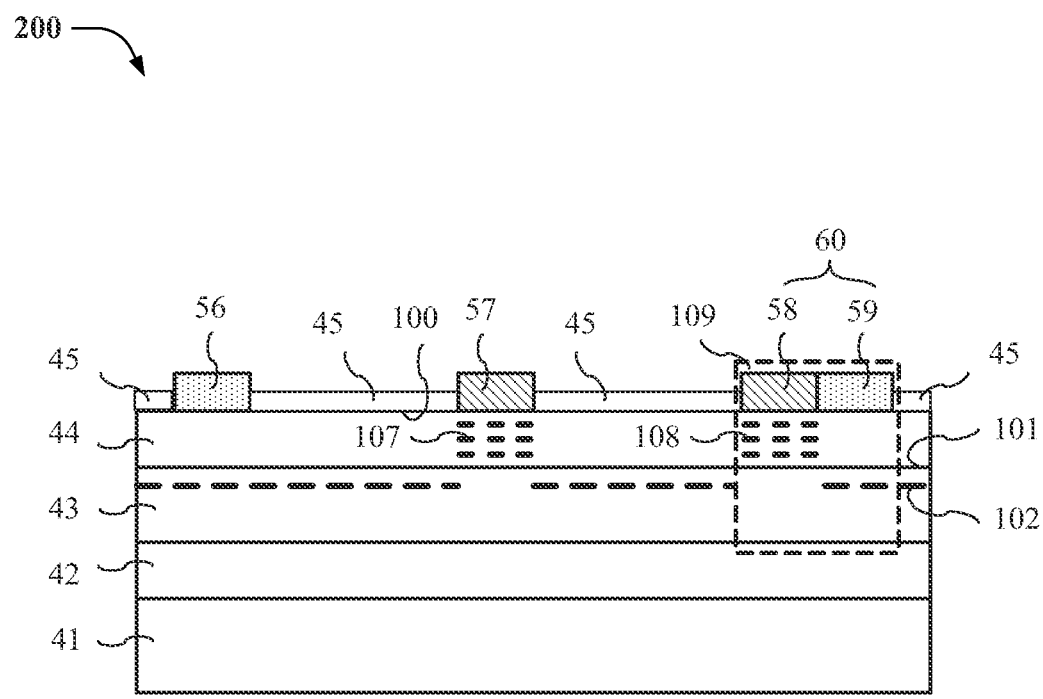
FIG. 2 illustrates a schematic cross-section of an E-mode HEMT including a hybrid drain electrode, in accordance with an embodiment.

FIG. 2 illustrates a schematic cross-section of an E-mode HEMT 200 including a hybrid drain electrode 60 utilizing a nitride semiconductor material (see above), in accordance with an embodiment. Hybrid drain electrode 60 can provide reverse blocking capability when an associated drain of E-mode HEMT 200 is biased with a negative voltage. Common symbols are used to illustrate common structures and layers of FIGS. 1 and 2; accordingly, a description of such symbols is omitted herein.

As illustrated by FIG. 2, hybrid drain electrode 60 can be made of electrically shorted Schottky (barrier) contact electrode 58 and ohmic contact electrode 59. A region 107 and a region 108 including permanently negatively charged ions can exist under Schottky contact electrode 57 and Schottky contact electrode 58, respectively. Such regions can deplete underlying 2DEG 102, forming respective normally-off channel sections. Further, a normally-off channel section under Schottky contact electrode 57 can provide E-mode HEMT 200 enhancement-mode, or normally-off, operation. Furthermore, a normally-off channel section under Schottky contact electrode 58 can provide E-mode HEMT 200 reverse blocking capability when hybrid drain electrode 60 is negatively biased, while contributing small onset voltage if E-mode HEMT 200 is in a forward biased on-state. Further, the normally-off channel section can form hybrid drain electrode region 109, which includes an ohmic contact section under ohmic contact electrode 59.

In another aspect (not shown), another Schottky barrier contact can be electrically shorted in series with hybrid drain electrode 60 of E-mode HEMT 200, and placed toward a gate electrode side of E-mode HEMT 200.

Figure 3:
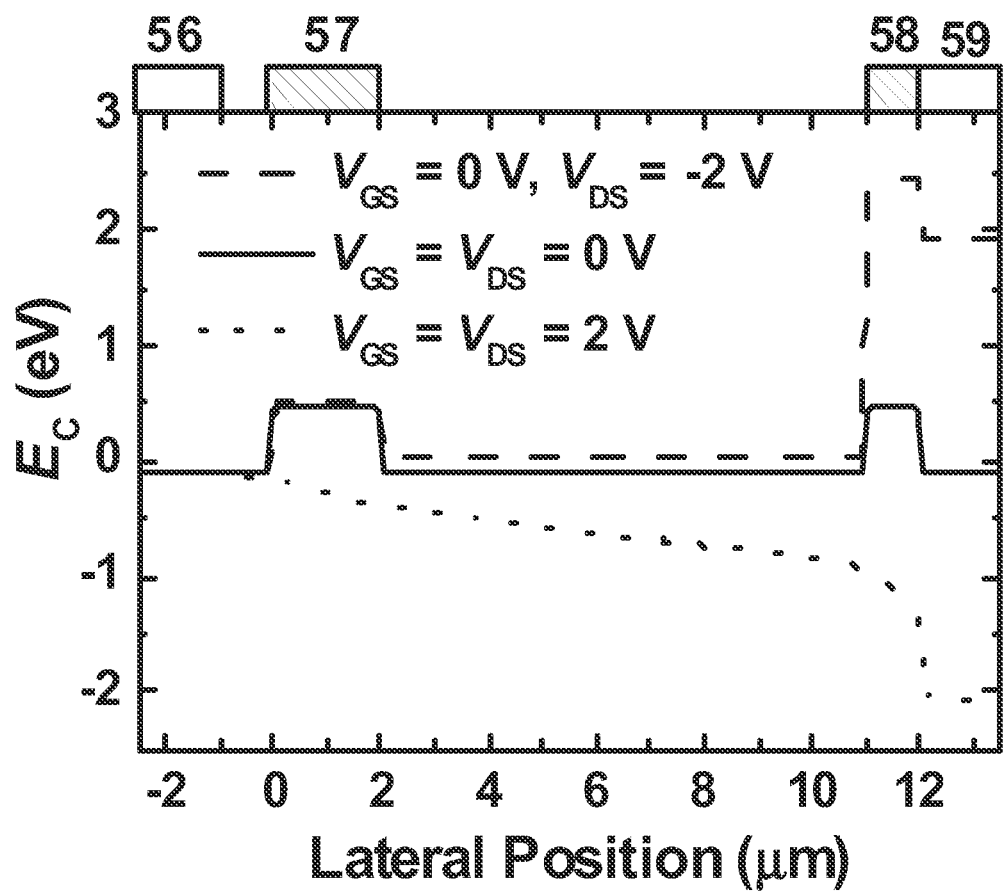
FIGS. 3 and 4 illustrate a simulated conduction band minimum ($E_C$) at a hetero-interface versus lateral position in E-mode HEMT 200 and a conventional E mode HEMT, respectively, in accordance with an embodiment.
Figure 4:
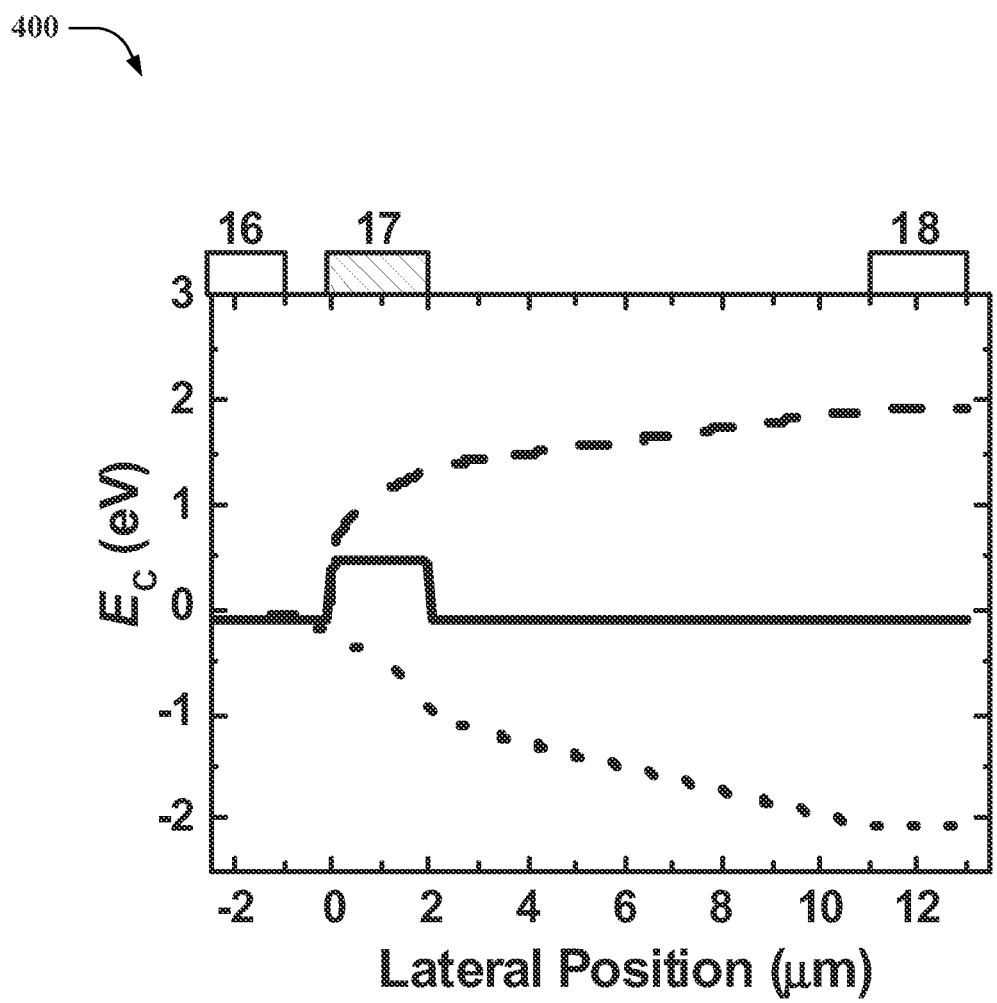

Now referring to FIGS. 3 and 4, a simulated conduction band minimum ($E_C$) at hetero-interface 101 versus lateral position in E-HEMT 200 (see 300) and a conventional E-HEMT (see 400) are illustrated, in accordance with an embodiment. Locations of source electrode 56, gate electrode 57, and hybrid drain electrode 60 of E-HEMT 200; and of source electrode 16, gate electrode 17, and drain electrode 18 of the conventional E-HEMT (not shown) are illustrated at the top of 300 and 400, respectively. As illustrated by FIG. 3, when E-HEMT 200 is forward biased at $V_{GS}=V_{DS}=2$ V, a barrier at hybrid drain electrode 60 is eliminated by positive drain voltage, with 2DEG 102 induced under both gate Schottky contact 57 and drain Schottky contact 58, effectively turning on E-mode HEMT 200. Further, at $V_{GS}=V_{DS}=0$ V, in addition to an energy barrier formed under gate electrode 57 that can provide E-mode operation, E-HEMT 200 features another energy barrier under Schottky contact electrode 58.

Furthermore, when E-HEMT 200 is reverse biased with $V_{GS}=0$ V and $V_{DS}=-2$ V, a barrier at hybrid drain electrode 60 can shut off a 2DEG channel, e.g., 102, underneath hybrid drain electrode 60 to prevent any current from flowing from source or gate to drain, providing protection against negative drain voltage. On the other hand, and now referring to FIG. 4, the conventional E-mode HEMT suffers from large current flow at negative drain bias as no barrier exists near drain 18.

Figure 5:
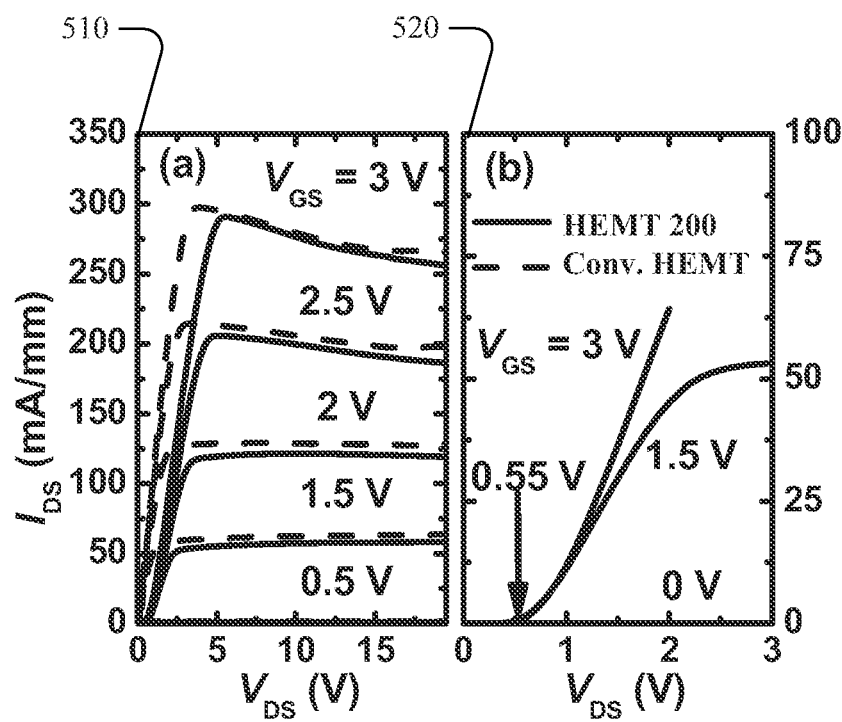
FIGS. 5 and 6 illustrate forward DC-output characteristics and forward and reverse blocking characteristics of an experimentally fabricated E-mode HEMT 200 and an experimentally fabricated conventional E-mode HEMT, in accordance with an embodiment.
Figure 6:
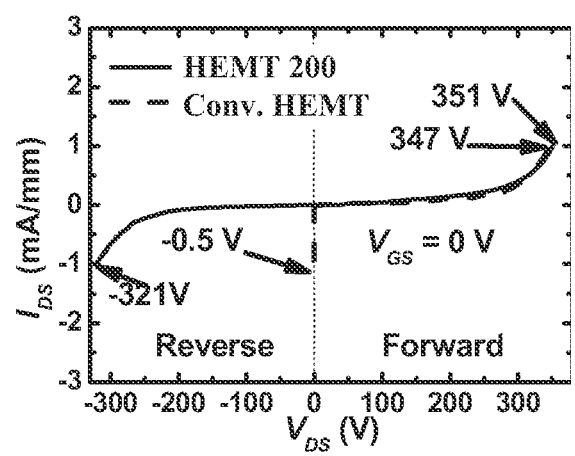

FIGS. 5 and 6 illustrate, in accordance with an embodiment, forward DC-output characteristics and forward and reverse blocking characteristics, respectively, of an experimentally fabricated E-mode HEMT 200 (see solid lines) and an experimentally fabricated conventional E-mode HEMT (see dashed lines) with the same or similar physical dimensions as experimentally fabricated E-mode HEMT 200—absent a Schottky contact electrode at a drain terminal of the experimentally fabricated conventional E-mode HEMT. Experimentally fabricated E-mode HEMT 200 includes a hybrid drain electrode 60 that is 2×50 µm wide and features: a drain-side Schottky contact 58 that is 1 µm in length, a gate-drain spacing of 9 µm, a gate 57 length of 2 µm, and a gate-source spacing of 1 µm. As stated above, the experimentally fabricated conventional E-mode HEMT features the same or similar physical dimensions as experimentally fabricated E-mode HEMT 200, except for the absence of the Schottky contact electrode at the drain terminal of the experimentally fabricated conventional E-mode HEMT.

Plot 510 illustrates drain-source current and voltage of experimentally fabricated E-mode HEMT 200 and experimentally fabricated conventional E-mode HEMT at various applied gate-source voltages, in which a threshold voltage larger than 0.5 V resulted in drain forward-bias. Further, as illustrated by plot 510, experimentally fabricated E-mode HEMT 200 achieved no degradation in drain saturation current compared with the experimentally fabricated conventional E-mode HEMT. Furthermore, Plot 520 illustrates an onset of drain current flow in experimentally fabricated E-mode HEMT 200 resulting in an onset drain-source voltage of 0.55 V at $I_{DS}$=1 mA/mm.

FIG. 6 illustrates measured forward and reverse blocking characteristics of experimentally fabricated E-mode HEMT 200 (solid line) and the experimentally fabricated conventional E-mode HEMT (dashed line). Although the experimentally fabricated conventional E-mode HEMT provided a forward blocking voltage of 347 V, reverse turn-on of the conventional E-mode HEMT occurred at $V_{DS}$=−0.5 V. On the other hand, experimentally fabricated E-mode HEMT 200 achieved a forward blocking voltage of 351V (at $V_{GS}$=0 V) and a reverse blocking voltage of −321 V when reverse biased. As illustrated, breakdown voltage is defined as a voltage with an off-state drain current reaching 1 mA/mm.

Figure 7:
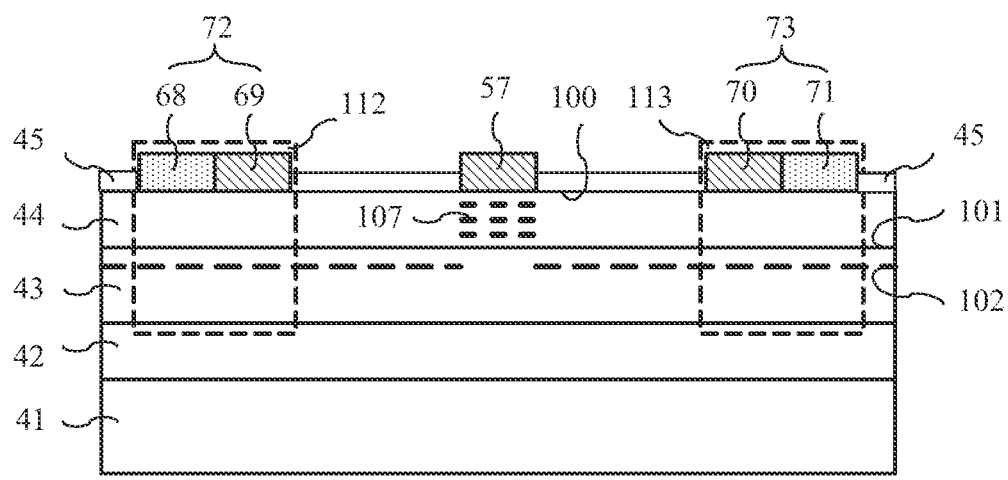
FIG. 7 illustrates a schematic cross-section of an E-mode HEMT including a hybrid drain electrode and a hybrid source electrode, in accordance with an embodiment.

Now referring to FIG. 7, a schematic cross-section of an E-mode HEMT 700 utilizing a nitride semiconductor material (see above) and including a hybrid drain electrode 73 and a hybrid source electrode 72 is illustrated, in accordance with an embodiment. Common symbols are used to illustrate common structures and layers of FIGS. 1 and 7; accordingly, a description of such symbols is omitted herein.

As illustrated by FIG. 7, a hybrid source electrode 72 can be made by electrically shorting ohmic contact electrode 68 and Schottky contact electrode 69. Similarly, a hybrid drain electrode 73 can be made by electrically shorting ohmic contact electrode 71 and Schottky contact electrode 70. Hybrid source electrode 72 and hybrid drain electrode 73 can be formed on the primary surface 100 of semiconductor layer 44. Under Schottky contact electrode 69 and Schottky contact electrode 70, 2DEG 102 can exist, forming normally-on channel sections.

Further, hybrid source electrode region 112 and hybrid drain electrode region 113 can be formed, including an ohmic contact section under ohmic contact electrodes 68 and 71, respectively, and a normally-on channel section under Schottky contact electrodes 69 and 70, respectively. Hybrid source electrode region 112 and hybrid drain electrode region 113 feature similar structure as a cathode region of embodiments of an L-FER, e.g., 1800, and an SBD, e.g., 1900, described below; as such, current flowing into hybrid source electrode 72 and hybrid drain electrode 73 is limited via the cathode region, e.g., if hybrid source electrode 72 or hybrid drain electrode 73 is negatively biased. Furthermore, if gate 57 is biased with a voltage higher than that of hybrid source electrode 72 or hybrid drain electrode 73, total gate current is limited. As such, E-mode HEMT 700 can (1) provide reverse blocking capability if hybrid source electrode 72 and/or hybrid drain electrode 73 is biased with a negative voltage; and (2) gate protection when gate electrode 57 is biased with a positive voltage.

Figure 8:
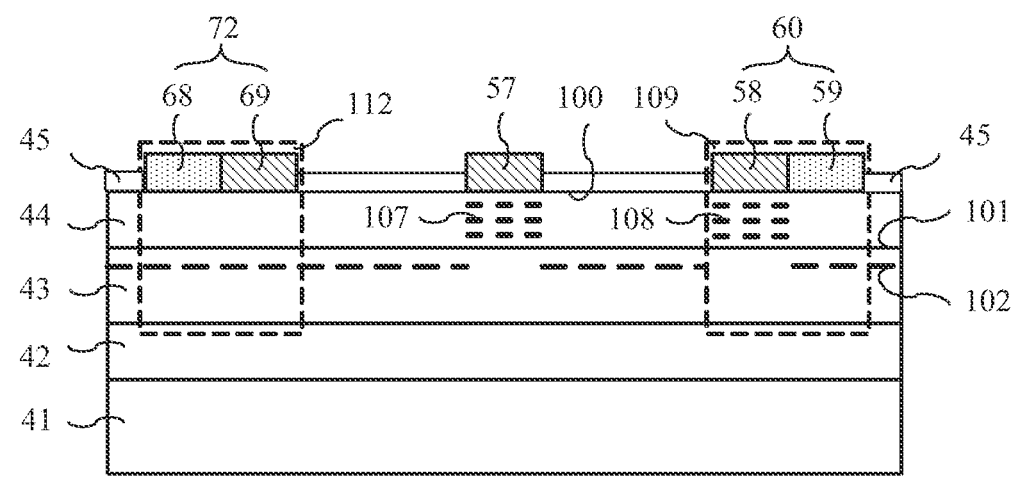
FIG. 8 illustrates a schematic cross-section of another E-mode HEMT including a hybrid drain electrode and a hybrid source electrode, in accordance with an embodiment.

FIG. 8 illustrates a schematic cross-section of an E-mode HEMT 800 utilizing a nitride semiconductor material (see above), and including a hybrid drain electrode 60 and a hybrid source electrode 72, in accordance with an embodiment. Common symbols are used to illustrate common structures and layers of FIGS. 2, 7, and 8; accordingly, a description of such symbols is omitted herein. As illustrated by FIG. 8, E-mode HEMT 800 can include hybrid drain electrode 60 and corresponding hybrid drain electrode region 109 (see FIG. 2), providing reverse blocking capability when hybrid drain electrode 60 is biased with a negative voltage. Further, E-mode HEMT 800 can include hybrid source electrode 72 and corresponding hybrid source electrode region 112 (see FIG. 7), providing gate over-current protection when gate electrode 57 is biased with a positive voltage.

In another aspect (not shown), another Schottky barrier contact can be electrically shorted in series with hybrid drain electrode 60 of E-mode HEMT 800, and placed toward a gate electrode side of E-mode HEMT 800.

In yet another aspect (not shown), an other E-mode HEMT utilizing a nitride semiconductor material (see above) can including hybrid drain electrode 60 and hybrid source electrode 72, and deliver gate over-current protection when a gate electrode of the E-mode HEMT is biased with a positive voltage, in accordance with an embodiment. Hybrid drain electrode 60 can include: a first Schottky contact at a gate electrode side of the E-mode HEMT, a first ohmic contact: (1) away from the gate electrode side; (2) in series with the first Schottky contact; and (3) electrically shorted with the first ohmic contact. Further, hybrid source electrode 72 can include: a second Schottky contact at the gate electrode side that is electrically shorted with a second ohmic contact away from the gate electrode side, and in series with the second Schottky contact.

Under the first Schottky contact region and the second Schottky contact region, a 2DEG channel 102 can exist—forming a first normally-on channel second and a second normally-on channel section, respectively. With the first normally-on channel section at the hybrid drain electrode, the current flow into the drain electrode is self-limited. With the first normally-on channel section at the hybrid source electrode, the current flow into the source electrode is self-limited. Therefore, excess gate current flowing into source electrode and drain electrode is self-limited, and gate over-current protection when the gate electrode is biased with a positive voltage is achieved.

Figure 9:
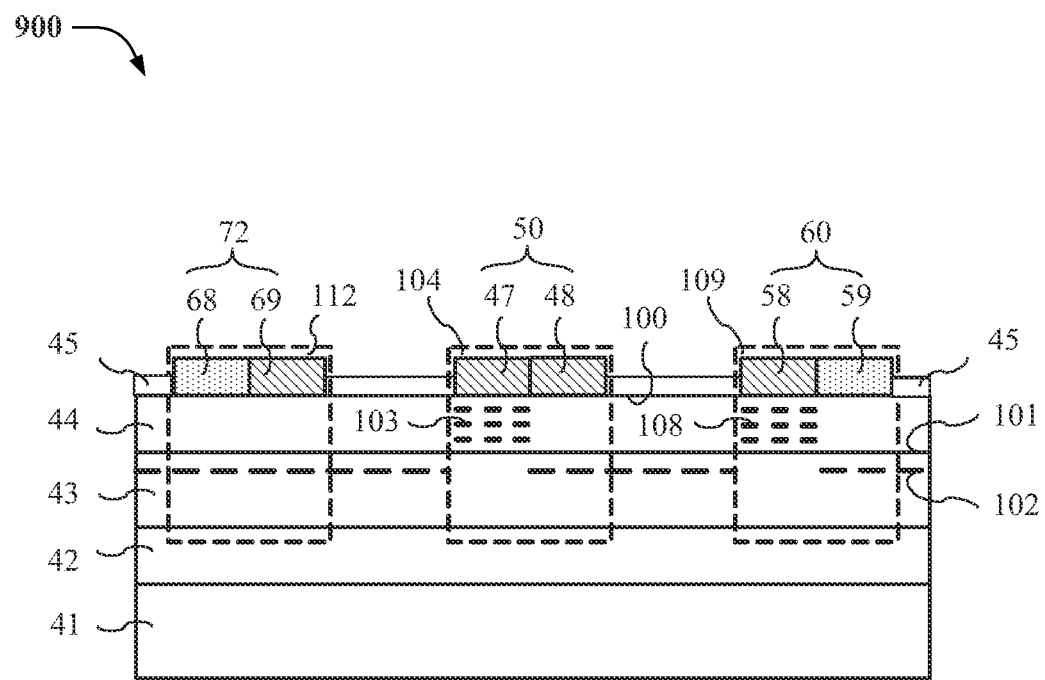
FIG. 9 illustrates a schematic cross-section of an E-mode HEMT including a hybrid gate electrode, a hybrid source electrode, and a hybrid drain electrode, in accordance with an embodiment.

FIG. 9 illustrates a schematic cross-section of an E-mode HEMT 900 utilizing a nitride semiconductor material (see above), and including a hybrid gate electrode 50, a hybrid source electrode 72, and a hybrid drain electrode 60, in accordance with an embodiment. Common symbols are used to illustrate common structures and layers of FIGS. 1 and 9; accordingly, a description of such symbols is omitted herein. As illustrated by FIG. 9, E-mode HEMT 900 can include hybrid drain electrode 60 and corresponding hybrid drain electrode region 109 (see FIG. 2), providing reverse blocking capability when hybrid drain electrode 60 is biased with a negative voltage. Further, E-mode HEMT 900 can include hybrid source electrode 72 and corresponding hybrid source electrode region 112 (see FIG. 5), providing gate over-current protection when hybrid gate electrode 50 is biased with a positive voltage; E-mode HEMT 900 can include hybrid gate electrode 50 and corresponding hybrid gate electrode region 104 (see FIG. 2), simultaneously providing punch-through breakdown immunity and low on-resistance.

Figure 10:
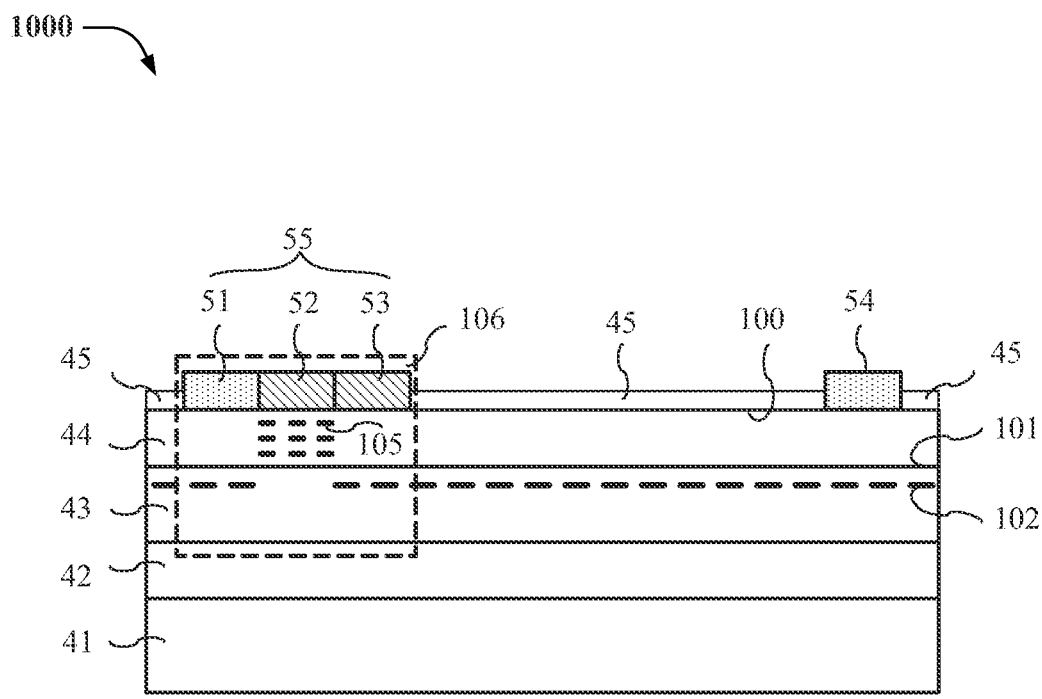
FIG. 10 illustrates a schematic cross-section of an L-FER including a hybrid anode electrode, in accordance with an embodiment.

FIG. 10 illustrates a schematic cross-section of a lateral field-effect rectifier (L-FER) 1000 utilizing a nitride semiconductor material (see above), and including a hybrid anode electrode, in accordance with an embodiment. As illustrated, L-FER 1000 can simultaneously provide channel punch-through breakdown immunity and low on-resistance. Common symbols are used to illustrate common structures and layers of FIGS. 1 and 10; accordingly, a description of such symbols is omitted herein.

Referring now to FIG. 10, hybrid anode electrode 55 can be made of electrically shorted ohmic contact electrode 51, Schottky contact electrode 52, and Schottky contact electrode 53. Further, cathode ohmic contact electrode 54, along with hybrid anode electrode 55, can be formed on the primary surface 100 of semiconductor layer 44. Furthermore, region 105 containing permanently negatively charged ions can exist under the Schottky contact electrode 52, which can deplete an underlying 2DEG 102, forming a normally-off channel section and providing blocking capability when L-FER 1000 is reverse biased.

Moreover, 2DEG 102 can exist under Schottky contact electrode 53, forming a normally-on channel section in hybrid anode electrode region 106. As such, under low reverse bias voltage, the normally-off channel section blocks current flow path, and the normally-on channel section gets pinched off when the cathode electrode (at 54) is biased under high positive voltage, which prevents the normally-off channel section from being punched through. Further, the normally-on channel section exhibits higher charge carrier density in an associated on-state of L-FER 1000, leading to higher current density/lower on-resistance.

Figure 11:
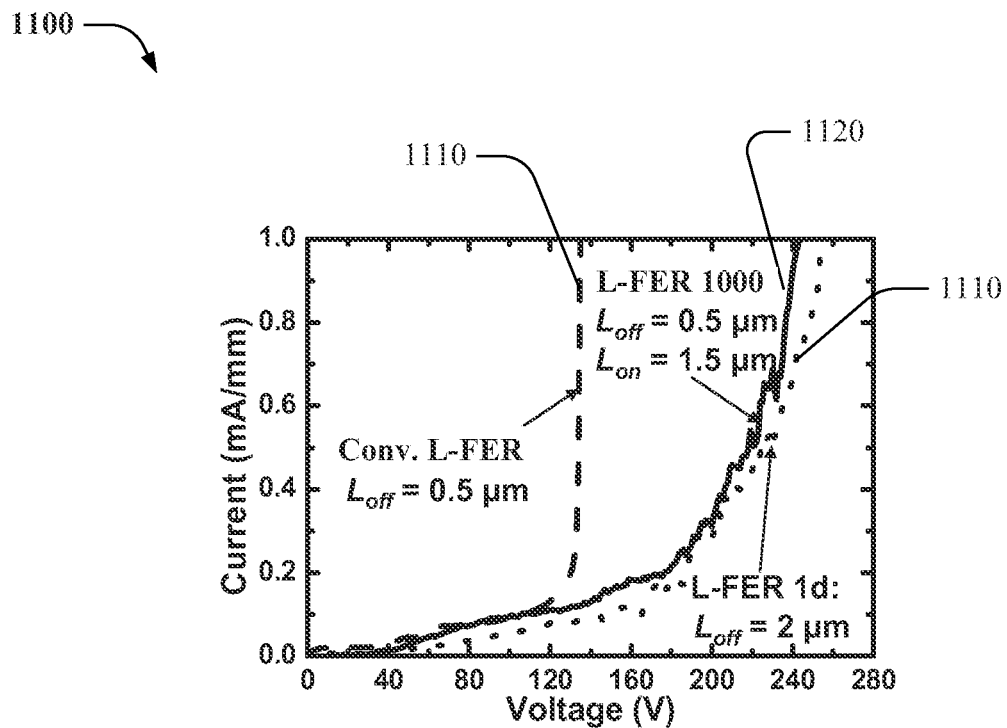
FIG. 11 illustrates experimentally obtained reverse biased I-V characteristics of an L-FER and a conventional L-FER, in accordance with an embodiment.

Now referring to FIG. 11, experimentally obtained reverse biased I-V characteristics of L-FER 1000 (solid line 1120), compared with experimentally obtained reverse biased I-V characteristics of a conventional L-FER (dashed lines 1110), are illustrated, in accordance with an embodiment. Experimentally fabricated L-FER 1000 included a hybrid anode electrode 55 including: a Schottky contact electrode 52 of length 0.5 μm (or normally-off channel section length $L_{off}$=0.5 μm); a Schottky contact electrode 53 length of 1.5 μm (or normally-on channel section length $L_{on}$=1.5 μm); and a distance between anode electrode 55 and cathode electrode 54 of 5 μm.

Further, a distance between an anode electrode and a cathode electrode of an experimentally fabricated conventional L-FER was 5 μm. Furthermore, a length of a Schottky contact electrode of the experimentally fabricated conventional L-FER was 0.5 μm ($L_{off}$=0.5 μm) and 2 μm ($L_{off}$=2 μm), respectively. As illustrated by FIG. 11, experimentally fabricated L-FER 1000 achieved a BV of 245 V (measured at a leakage current reaching 1 mA/mm, with $L_{off}$=0.5 μm), which was approximately 81% higher than a BV of 135 V obtained via the experimentally fabricated conventional L-FER ($L_{off}$=0.5 μm).

Figure 12:
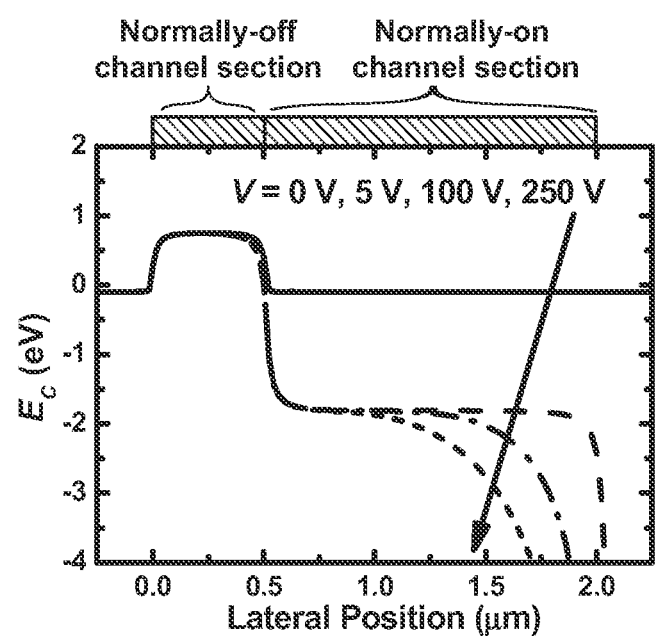
FIG. 12 illustrates a simulated electron band minimum ($E_C$) in a 2DEG channel versus lateral position of an L-FER, in accordance with an embodiment.

Referring now to FIG. 12, a simulated electron band minimum ($E_C$) in 2DEG channel (102) versus lateral position of L-FER 1000 (when reverse biased) is illustrated, in accordance with an embodiment. At zero bias, L-FER 1000 features an electron energy barrier under the Schottky contact electrode 52 (illustrated as "normally-off channel section" in FIG. 12) with a fully turned-on 2DEG channel under the Schottky contact electrode 53 (illustrated as "normally-on channel section" in FIG. 12).

Further, when reverse biased at 5 V, the 2DEG channel section under Schottky contact electrode 53 (or the normally-on section) is pinched off and shares a large part of the voltage drop across L-FER 1000. As illustrated by FIG. 12, additionally applied reverse bias, e.g., 250 V, can be supported by the 2DEG channel section under Schottky contact 53, preventing the channel section under Schottky contact electrode 52 from being punched through. As such, L-FER 1000 with a short, normally-off channel section, e.g., $L_{off}$=0.5 μm, can achieve a punch-through breakdown immunity and a BV comparable to that of an experimentally fabricated conventional L-FER associated with a longer normally-off channel section length, e.g., $L_{off}$=2.0 μm. (See, e.g., 1110).

Figure 13:
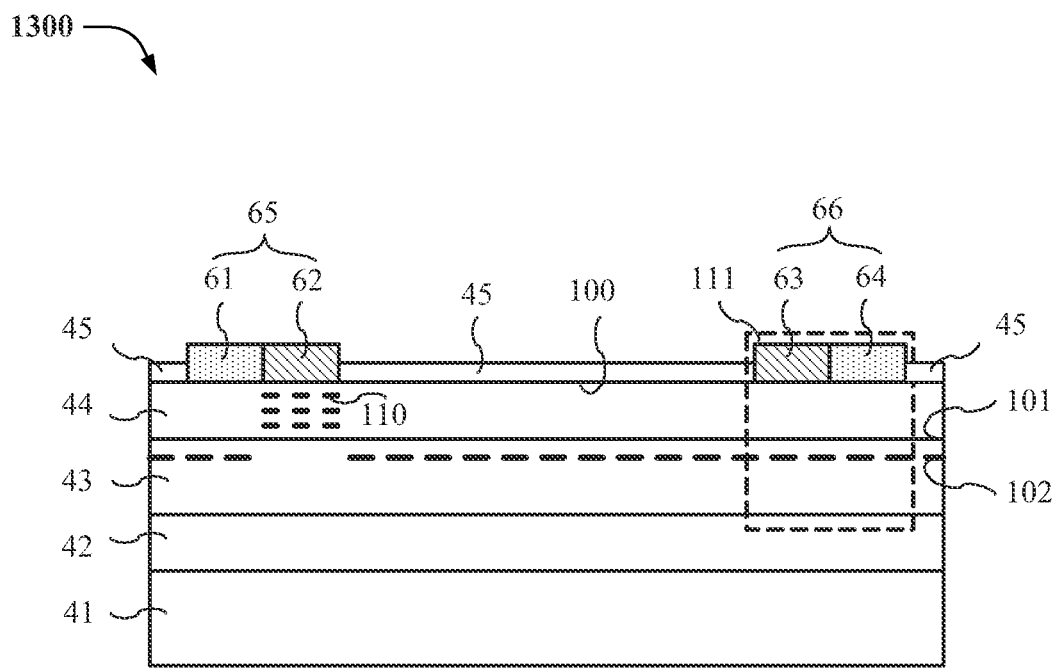
FIG. 13 illustrates a schematic cross-section of an L-FER including a hybrid cathode electrode, in accordance with an embodiment.

FIG. 13 illustrates a schematic cross-section of a lateral field-effect rectifier (L-FER) 1300 utilizing a nitride semiconductor material (see above), and including a hybrid cathode electrode, in accordance with an embodiment. As illustrated, L-FER 1300 can limit on-state current when L-FER 1300 is forward biased. Common symbols are used to illustrate common structures and layers of FIGS. 1 and 13; accordingly, a description of such symbols is omitted herein.

In an aspect, hybrid cathode electrode 66 can be made by electrically shorting ohmic contact electrode 64 and Schottky contact electrode 63. Further, anode 65, along with hybrid cathode electrode 66, can be formed on the primary surface 100 of semiconductor layer 44; anode 65 can be made by electrically shorting Schottky contact electrode 62 and ohmic contact electrode 61. Furthermore, region 110, e.g., including permanently negatively charged ions, can be included under Schottky contact electrode 62, and can deplete the underlying 2DEG 102, forming a normally-off channel section and providing L-FER reverse bias blocking capability.

Moreover, a 2DEG 102 channel can exist under Schottky contact electrode 63, forming a normally-on channel section. Also, hybrid cathode electrode region 111, including an ohmic contact section under electrode 64 and a normally-on channel section under Schottky electrode 63, can be formed. At low forward current density, voltage drop across the normally-on channel section can be negligible compared to a pinch-off voltage of the normally-on channel section; thus, forward current flow can be un-effected and/or negligibly effected.

In contrast, at high current level(s), a corresponding voltage drop can be high enough to pinch-off the normally-on channel section at the edge of the Schottky cathode contact 63, resulting in saturation (or self-limitation) of forward current. As such, L-FER 1300 automatically provides current limiting functions if voltage drop across the normally-on channel section reaches the pinch-off voltage of the normally-on channel section, e.g., of the as-grown heterojunction formed by semiconductor layer 43 and semiconductor layer 44. As such, a current limiting level of L-FER 1300 can be determined, set, programmed, etc. via two factors: the length of Schottky contact electrode 63 and the pinch-off voltage of the normally-on channel.

Figure 14:
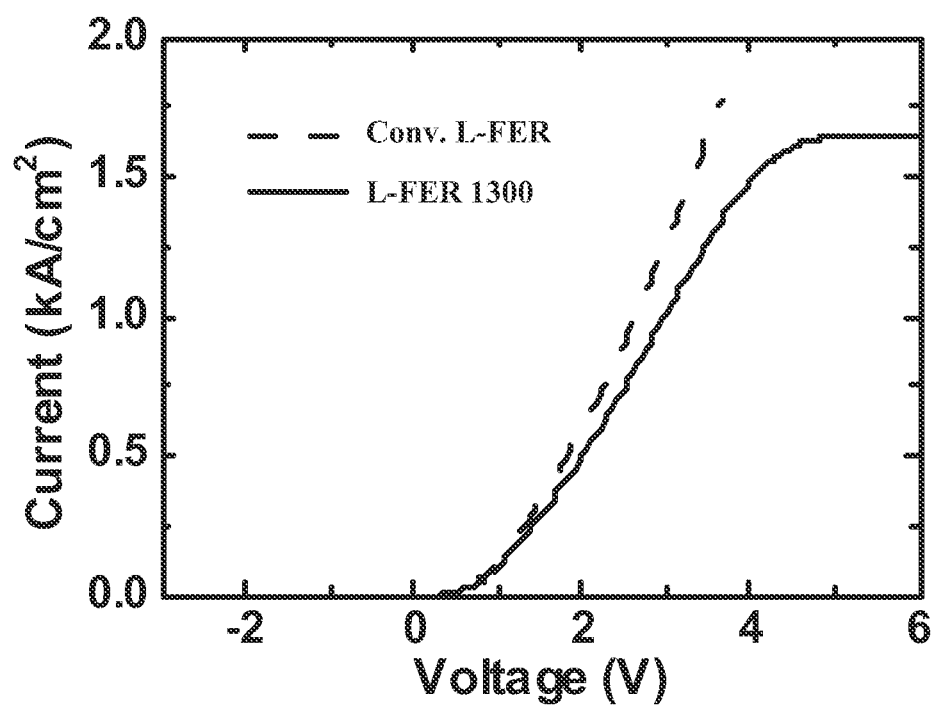
FIGS. 14 and 15 illustrate on-state and off-state current-voltage (I-V) characteristics of a conventional L-FER and L-FER 1300, respectively, in accordance with an embodiment.
Figure 15:
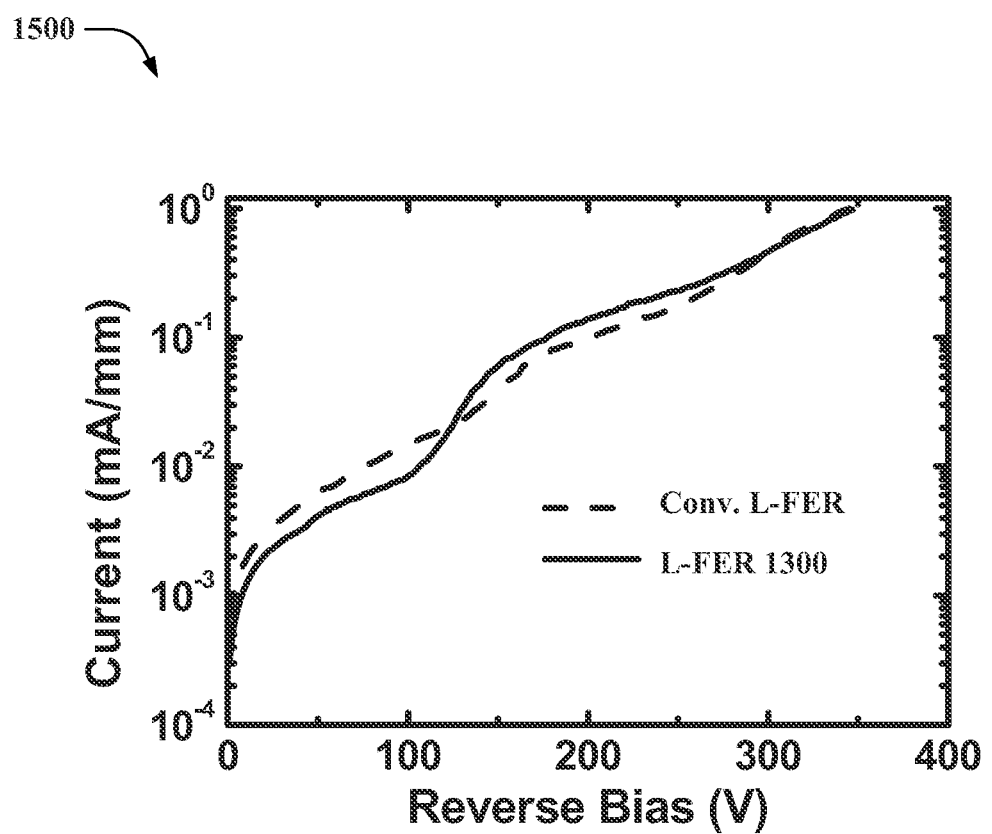

Referring now to FIGS. 14 and 15, experimentally obtained on-state and off-state current-voltage (I-V) characteristics of a conventional L-FER (dashed line) and L-FER 1300 (solid line) are illustrated, respectively, in accordance with an embodiment. Experimentally fabricated L-FER 1300 included an anode-side Schottky contact electrode 62 2 μm long, a cathode-side Schottky contact electrode 63 2 μm long, and an anode-cathode spacing of 7 μm. Further, fabricated conventional L-FER included an anode side Schottky contact electrode length of 2 µm, no cathode side Schottky contact electrode, and an anode-cathode spacing of 9 µm.

As illustrated by FIG. 14, without current limiting capability, the on-state current of conventional L-FER increases (see dotted line) with forward bias voltage until, e.g., excessive current (or heat) destroys the device. On the other hand, the forward bias, on-state current of L-FER 1300 (solid line) was self-limited at certain current levels depending on a length of cathode Schottky contact 63. For example, with a cathode Schottky contact 63 length of 2 µm, the on-state current was limited, via L-FER 1300, to 1.56 kA/cm$^2$ (with an active device area including a total ohmic contact length of 3 µm at cathode and anode electrodes of L-FER 1300). Further, no significant degradation in forward current density up to forward bias of 1.5 V was observed in L-FER 1300. Furthermore, as shown in FIG. 15, a reverse breakdown voltage (BV) of 347 V (measured at a leakage current of 1 mA/mm) was obtained in L-FER 1300 (see solid line), compared to 345 V obtained in the conventional L-FER. (See dashed line).

Figure 16:
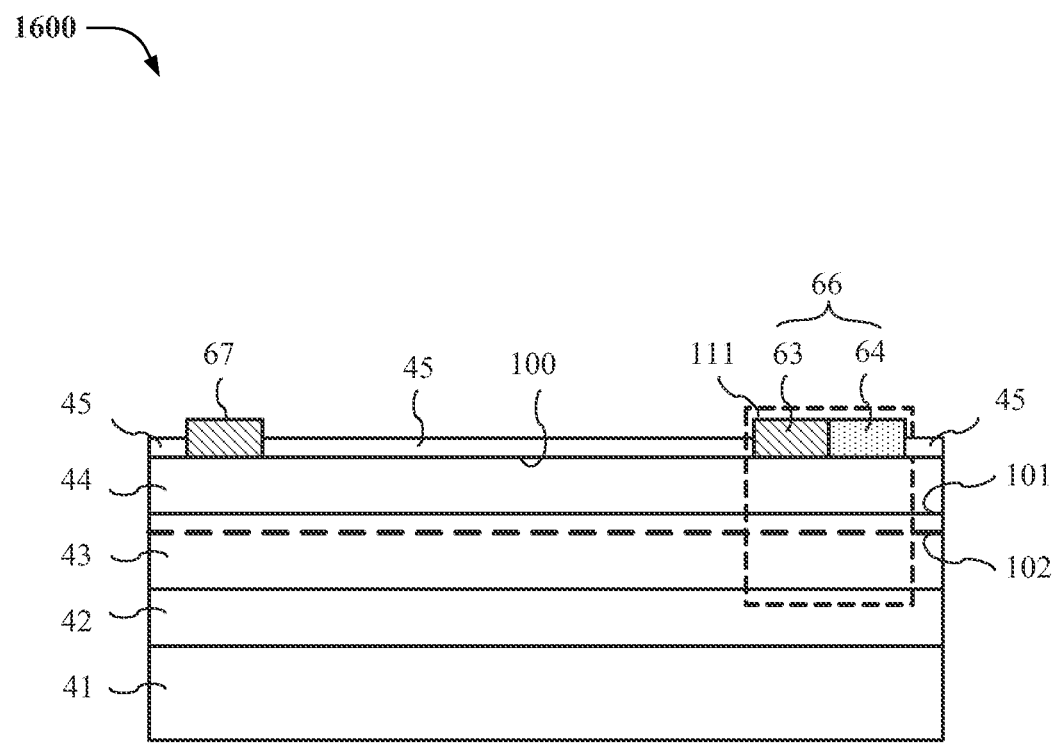
FIG. 16 illustrates a schematic cross-section of a Schottky barrier diode (SBD) including a hybrid cathode electrode, in accordance with an embodiment.
Figure 17:
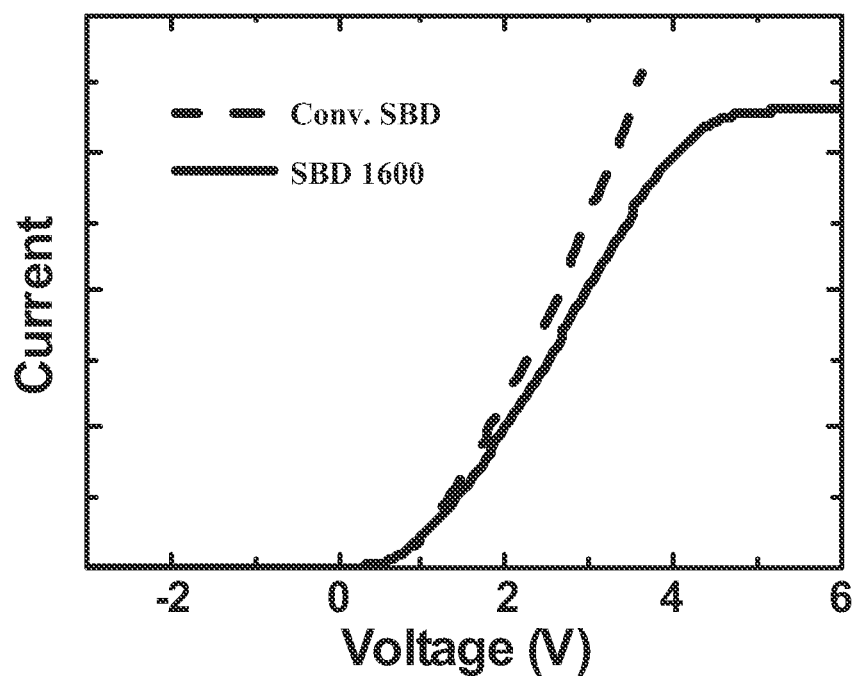
FIG. 17 illustrates on-state I-V characteristics of a Schottky barrier diode (SBD) and a conventional SBD, in accordance with an embodiment.

FIG. 16 illustrates a schematic cross-section of a Schottky barrier diode (SBD) 1600 utilizing a nitride semiconductor material (see above), and including a hybrid cathode electrode 66, in accordance with an embodiment. Common symbols are used to illustrate common structures and layers of FIGS. 13 and 16; accordingly, a description of such symbols is omitted herein. Compared with the L-FER 1300, the anode of SBD 1600 is made of Schottky contact electrode 67, instead of hybrid anode 65. Referring now to FIG. 17, on-state I-V characteristics of SBD 1600 and a conventional SBD (not shown) are illustrated, in accordance with an embodiment. As illustrated by FIG. 17, without current limiting capability, on-state current of the conventional SBD (see dashed line) increases with the forward bias voltage until, e.g., excessive current (or heat) destroys the device.

On the other hand, forward bias, on-state current of SBD 1600 (solid line) was self-limited at certain current levels depending on a length of cathode Schottky contact 63. As such, SBD 1600 features forward biased on-State current limiting capability.

Figure 18:
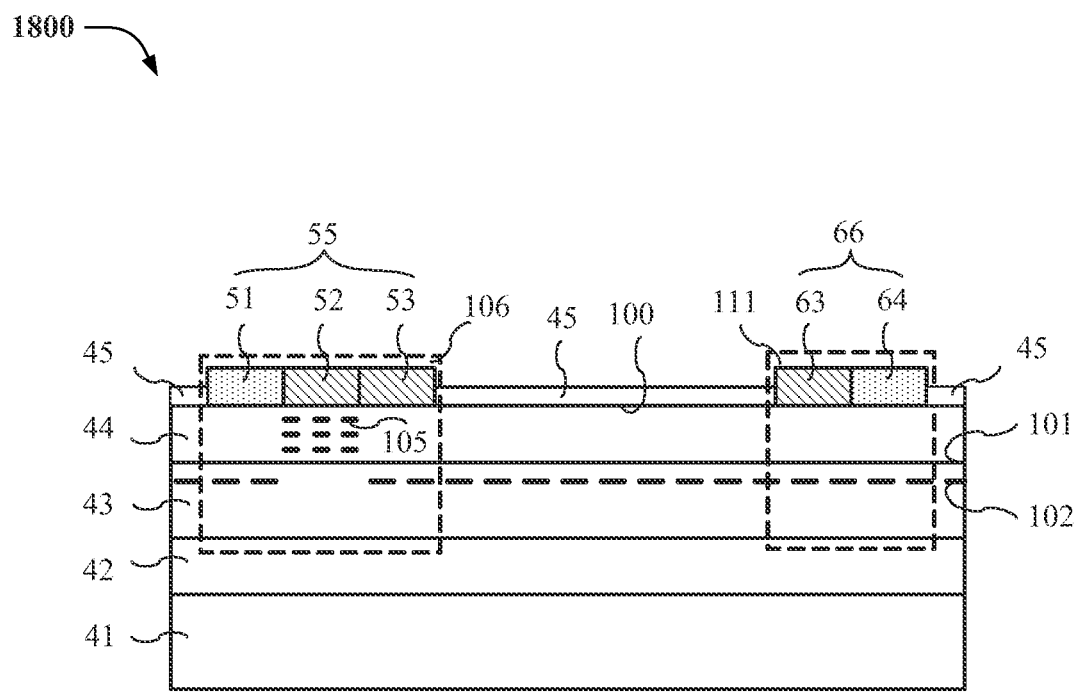
FIG. 18 illustrates a schematic cross-section of another L-FER, in accordance with an embodiment.

FIG. 18 illustrates schematic cross-section of another L-FER (1800) utilizing a nitride semiconductor material (see above), in accordance with an embodiment. Common symbols are used to illustrate common structures and layers of FIGS. 10, 13, and 18; accordingly, a description of such symbols is omitted herein.

L-FER 1800 can include hybrid anode electrode 55 and corresponding hybrid anode electrode region 105 of L-FER 1000 (see FIG. 10), simultaneously delivering punch-through breakdown immunity and low on-resistance. Further, L-FER 1800 can include hybrid cathode electrode 66 and corresponding hybrid cathode electrode region 111 of L-FER 1300 (see FIG. 13), delivering forward biased on-State current limiting capability.

It should be appreciated that embodiments associated with E-mode HEMT 200, 700, and 800 described above can include removing (permanently) negatively charged ions under gate electrode 57, which forms depletion-mode HEMT device(s) with hybrid electrode(s) associated with E-mode HEMT 200, 700, and 800. Further, in another aspect, normally-off channel regions/sections described above, and applicable to embodiments associated with the innovation, can be formed by other methods, such as by reducing thickness of semiconductor layer 44. Furthermore, in other embodiments of the innovation, an insulator, e.g., as SiN, SiO$_2$, or Al$_2$O$_3$, etc. can be placed between Schottky contact metal (associated with Schottky contacts described herein) and semiconductor layer 44.

FIGS. 19-26 illustrate methodologies in accordance with the disclosed subject matter. For simplicity of explanation, the methodologies are depicted and described as a series of acts. It is to be understood and appreciated that the subject innovation is not limited by the acts illustrated and/or by the order of acts. For example, acts can occur in various orders and/or concurrently, and with other acts not presented or described herein. Furthermore, not all illustrated acts may be required to implement the methodologies in accordance with the disclosed subject matter. In addition, those skilled in the art will understand and appreciate that the methodologies could alternatively be represented as a series of interrelated states via a state diagram or events. Additionally, it should be further appreciated that the methodologies disclosed hereinafter and throughout this specification are capable of being stored on an article of manufacture to facilitate transporting and transferring such methodologies to computers. The term article of manufacture, as used herein, is intended to encompass a computer program accessible from any computer-readable device, carrier, or media.

Figure 19:
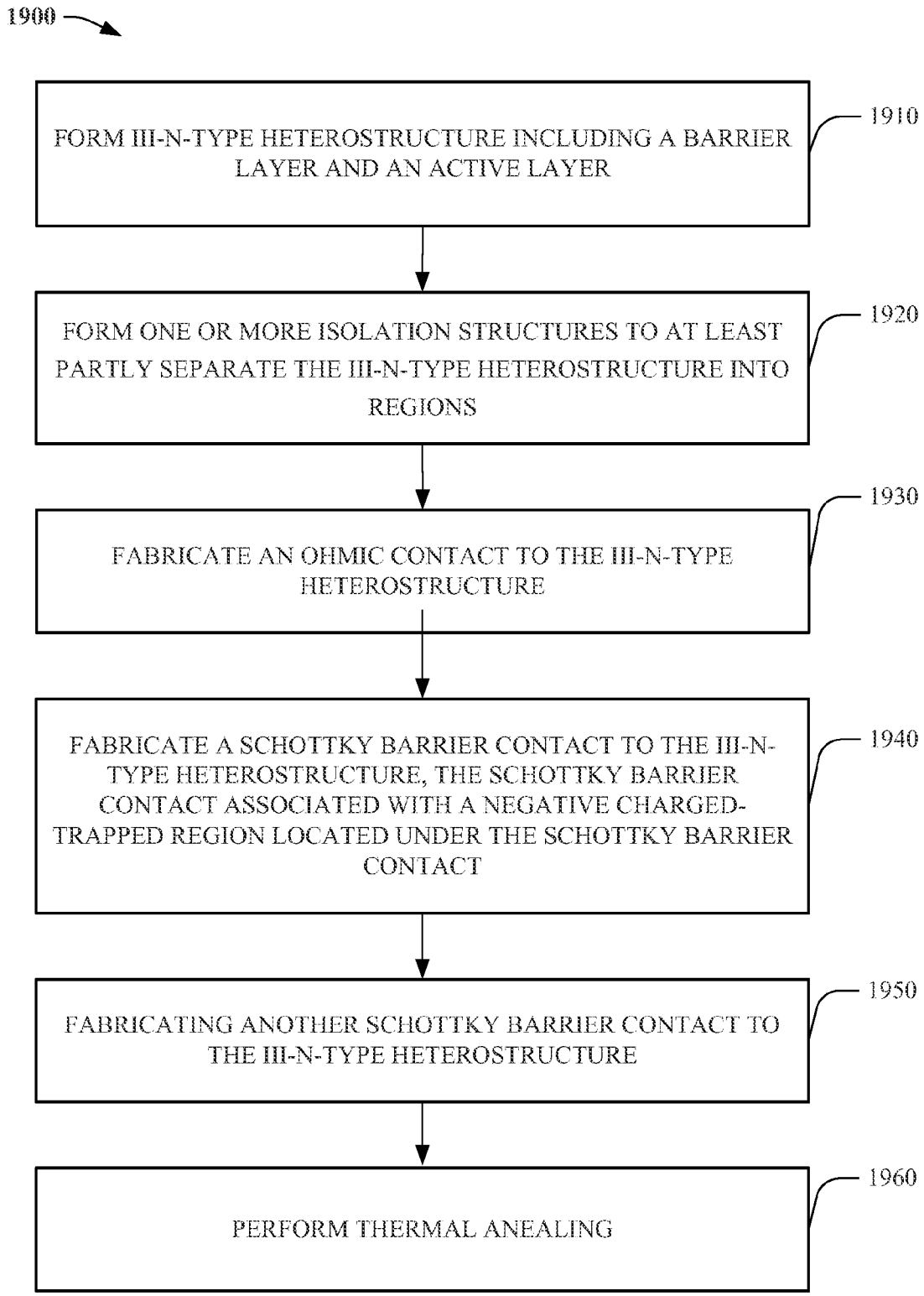
FIG. 19 illustrates a process for manufacturing hybrid transistors and rectifiers associated with FIGS. 1-18, in accordance with an embodiment.

Referring now to FIG. 19, a process 1900 for manufacturing hybrid transistors and rectifiers associated with FIGS. 1-18 is illustrated, in accordance with an embodiment. At 1910, a III-N-type heterostructure ("the semiconductor structure") can be formed to include a barrier layer and an active layer—the barrier layer and the active layer having different bandgaps. At 1920, one or more isolation structures can be formed in the semiconductor structure to at least partly separate the semiconductor structure into structure regions. At 1930, one or more ohmic contacts can be fabricated to the semiconductor structure. At 1940, a first Schottky barrier contact can be fabricated to the semiconductor structure, the first Schottky barrier contact including a permanently negative charge-trapped region located directly under the first Schottky contact. Alternatively, in one aspect (not shown), the first Schottky barrier contact can be fabricated to the semiconductor structure without locating the permanently negative charge-trapped charge under the first Schottky contact, e.g., for processing a D-mode HEMT in accordance with aspects described herein.

In another aspect, the permanently negative charge-trapped region can be formed via plasma treatment and/or low-energy ion implantation. In yet another aspect, the permanently negative charge-trapped region can be formed via the plasma treatment utilizing at least one of CF$_4$, SF$_6$, or BF$_3$.

Further, at 1950, a second Schottky barrier contact can be fabricated to the semiconductor structure. At 1960, thermal annealing can be performed, e.g., after formation of the first Schottky barrier contact and the second Schottky barrier contact. In another aspect (not shown), process 1900 can apply an insulator layer of at least one of silicon nitride, Al$_2$O$_3$, SiO$_2$, or Hafnium Oxide—located between at least one of the first Schottky barrier contact or the second Schottky barrier contact and the semiconductor structure.

FIGS. 20-26 illustrate process steps for fabricating an E-mode HEMT 200 including hybrid electrode(s) and an L-FER 1800 including hybrid electrode(s), in accordance with an embodiment. FIG. 20 illustrates a starting sample wafer 2000, including substrate layer 41, nitride material layer 42, nitride semiconductor channel layer 43, and nitride semiconductor layer 44. FIG. 21 illustrates forming two electrically isolated regions, or mesa (44a and 44b) on nitride semiconductor channel layer 43 of sample wafer 2100. In an aspect, the two mesa can be formed using Cl$_2$/He plasma dry etching in an inductively coupled plasma reactive ion etching (ICP-RIE) system.

Figure 22:
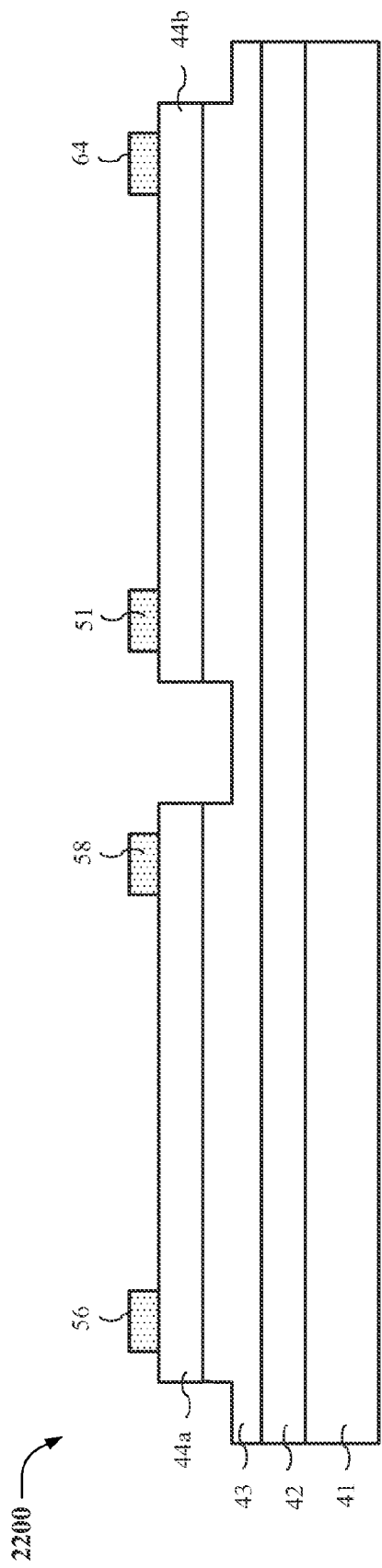

FIG. 22 illustrates forming ohmic contact electrodes 56 and 58 for E-mode HEMT 200, and ohmic contact electrodes 51 and 64 for L-FER 1800, via deposition of e-beam evaporated Ti/Al/Ni/Au (20 nm/150 nm/50 nm/80 nm) and rapid thermal annealing (RTA) at 830° C. for 38 s of sample wafer 2200. This step can form contacts on both L-FER 1800 and E-mode HEMT 200.

Figure 23:
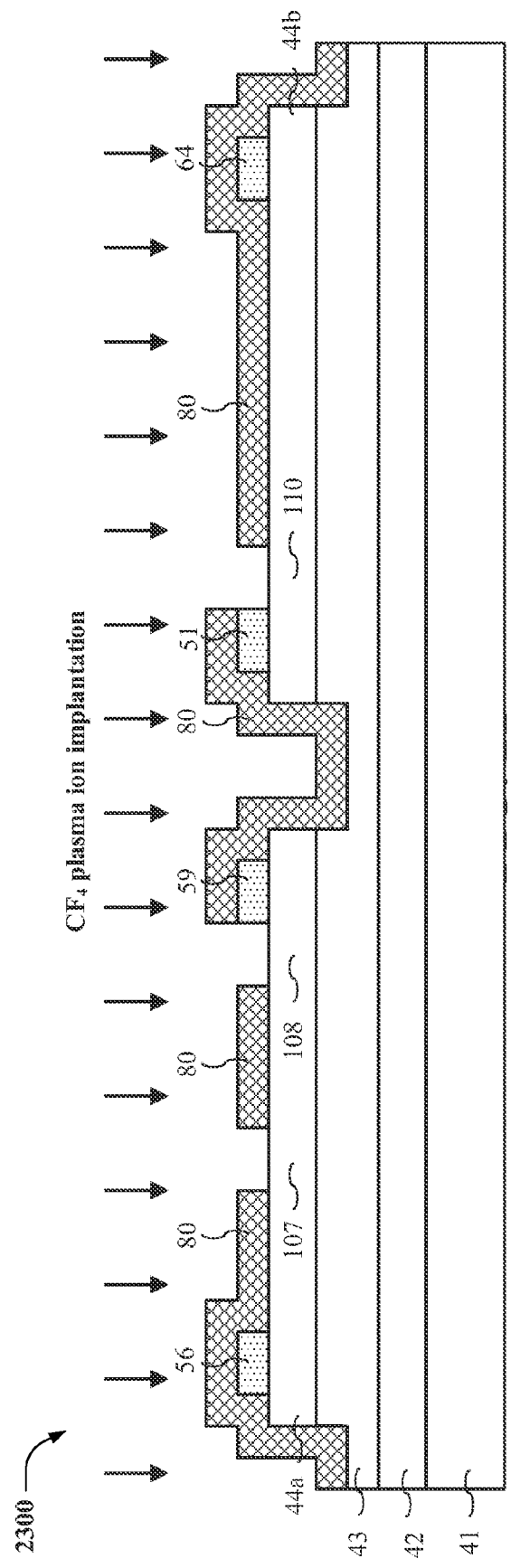

FIG. 23 illustrates implementing a self-aligned fluorine-based plasma treatment, or $CF_4$ plasma ion implantation—with opening(s) defined by photoresist layer 80—on sample wafer 2300. Fluorine implantation regions 107 and 108 can be formed for gate and hybrid drain regions of E-mode HEMT 200, respectively. Furthermore, fluorine implantation region 110 can be formed for a hybrid anode region of L-FER 1800.

Figure 24:
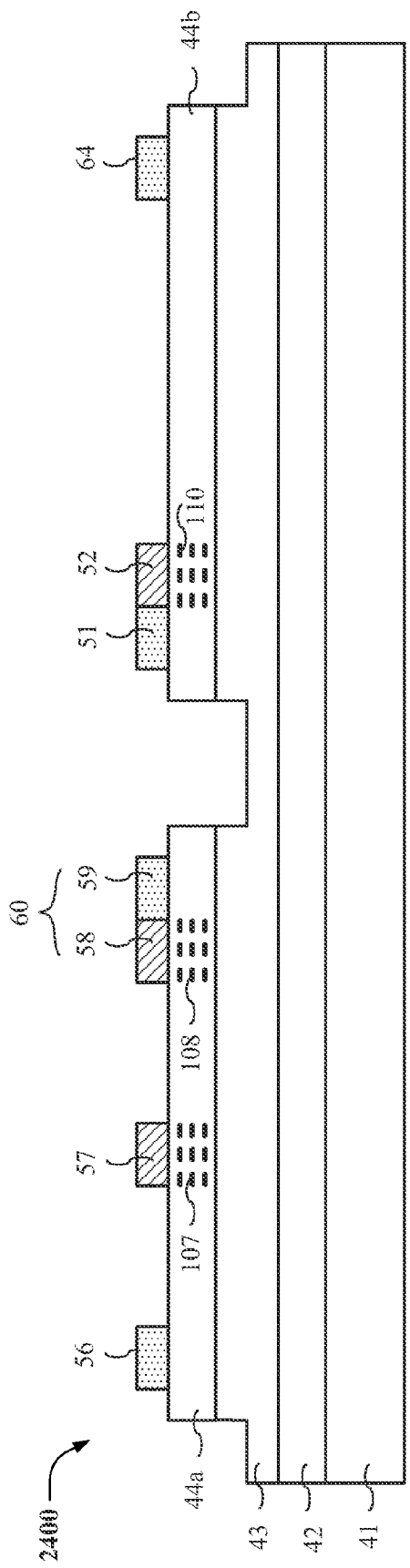

As illustrated by FIG. 24, e-beam evaporation and lift-off of Ni/Au Schottky contact electrodes 57, 58, and 52 can be performed on sample wafer 2400, without removing photoresist layer 80. For example, in the gate region of E-mode HEMT 200, Schottky contact 57 can be deposited on the uncovered surface of fluorine implantation region 107—forming gate 57. Further, in the hybrid drain region of HEMT 200, Schottky contact 58 can be deposited on the uncovered surface of fluorine implantation region 108, forming an electrically shorted Schottky contact 58 and ohmic contact 59. Furthermore, in the hybrid anode region of L-FER 1800, Schottky contact 52 can be deposited on the uncovered surface of fluorine implantation region 110, forming an electrically shorted Schottky contact 52 and ohmic contact 51.

Figure 25:
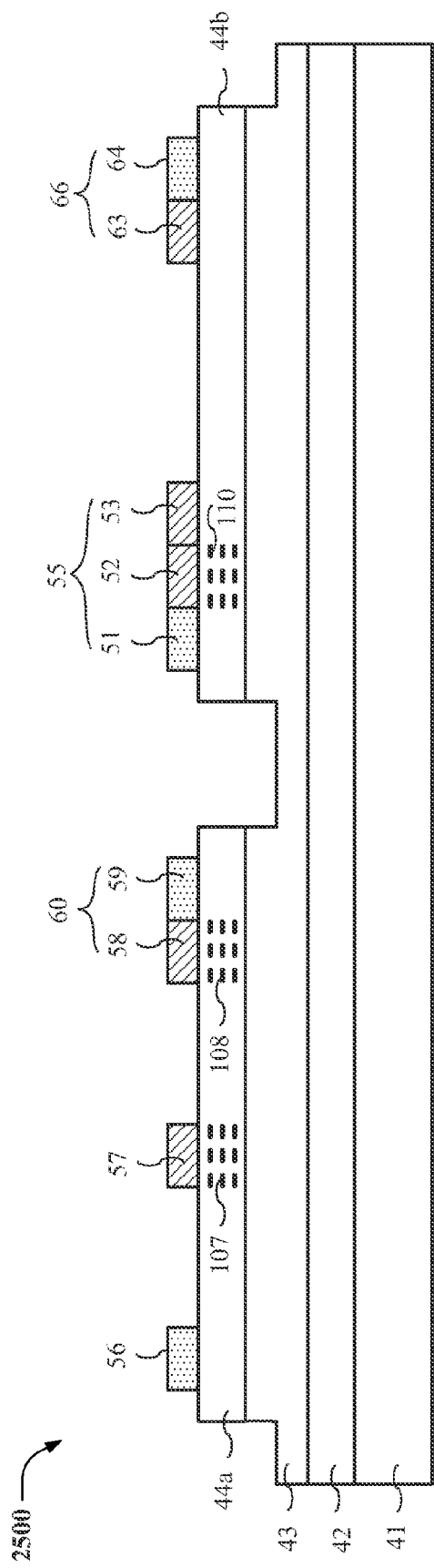

Subsequently, as illustrated by FIG. 25, another Schottky contact electrode formation can occur (via sample wafer 2500), followed by an e-beam evaporation and lift-off of Ni/Au without fluorine plasma ion implantation. For example, in the hybrid anode region of L-FER 1800, Schottky contact 53 can be deposited on the uncovered surface of semiconductor layer 44, forming electrically shorted Schottky contact 52, electrically shorted Schottky contact 53, ohmic contact 51, and hybrid anode electrode 55. Further, in the hybrid cathode region of L-FER 1800, Schottky contact 63 can be deposited on the uncovered surface of semiconductor layer 44, forming electrically shorted Schottky contact 63, electrically shorted Schottky contact 53, ohmic contact 64, and hybrid cathode electrode 66.

Figure 26:
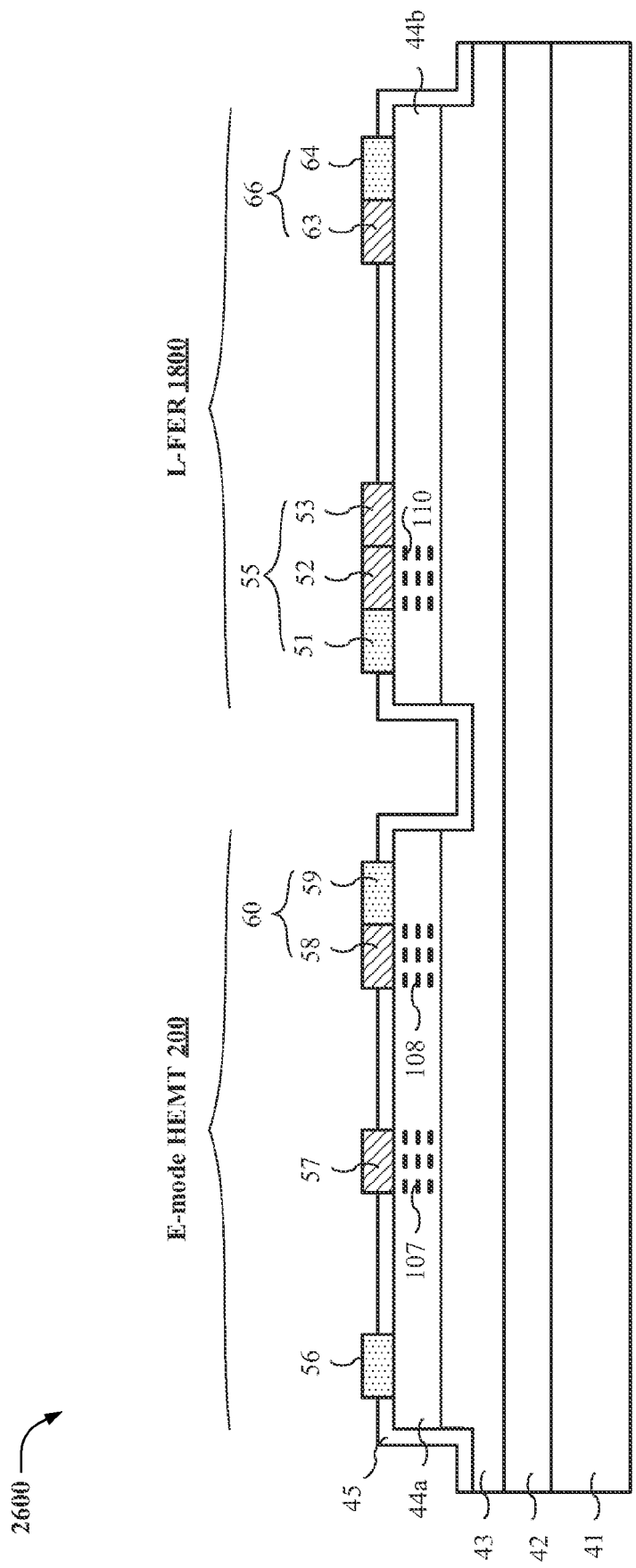

Furthermore, a post-gate annealing at 400° C. for 10 minutes can be performed to remove plasma-induced lattice damages and defects. After the post-gate annealing, a 300 nm thickness $SiN_X$ passivation layer 45 can be deposited on sample wafer 2600 via the plasma enhanced chemical vapor deposition, as shown in FIG. 26; as such, in an aspect, E-mode HEMT 200 and L-FER 1800 are fabricated.

Figure 27:
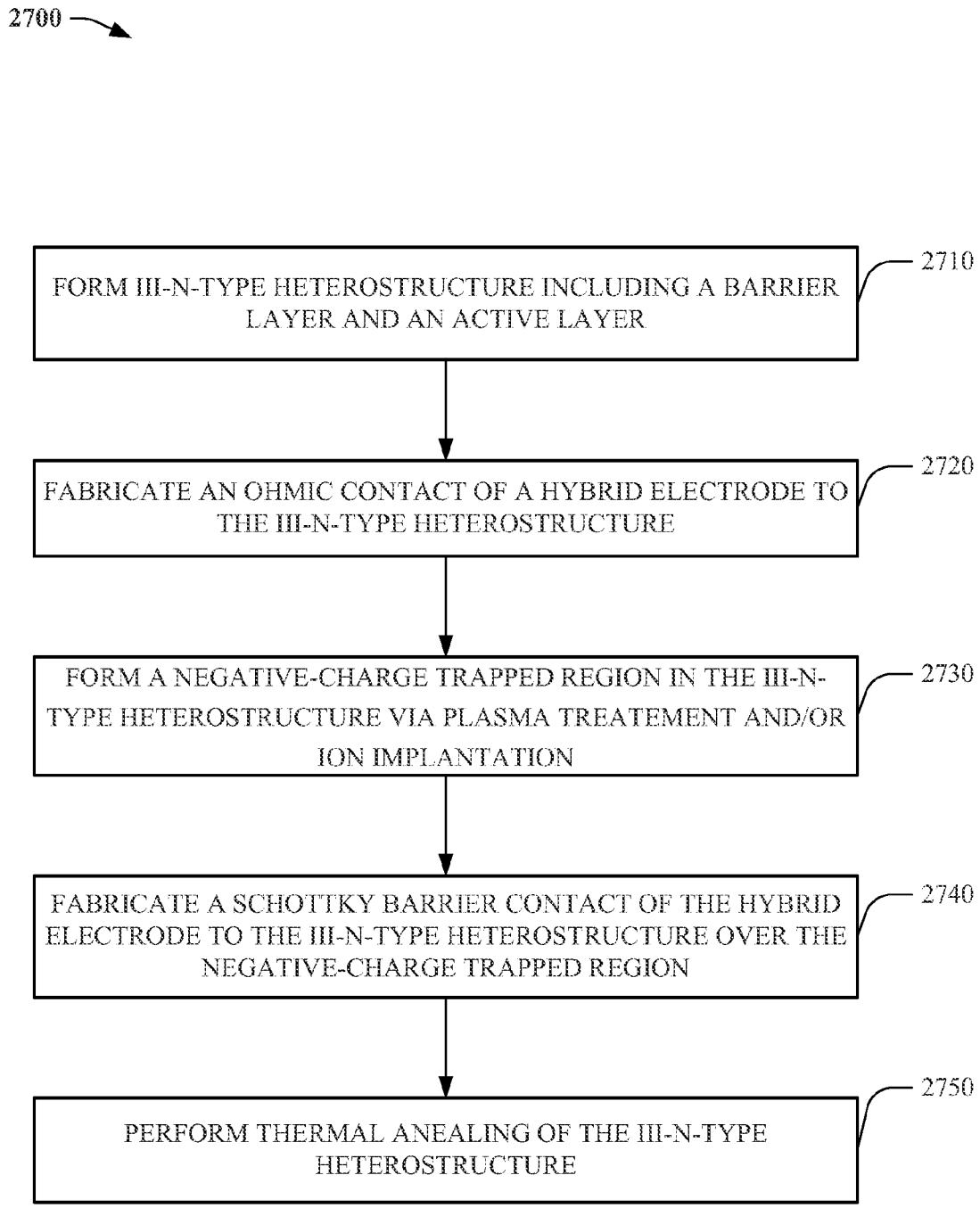
FIG. 27 illustrates a method for manufacturing a hybrid electrode, in accordance with an embodiment.

Now referring to FIG. 27, a process 2700 for manufacturing a hybrid electrode is illustrated, in accordance with an embodiment. At 2710, a III-N-type heterostructure including a barrier layer and an active layer can be formed. In an aspect, the barrier layer and the active layer can have different bandgaps. At 2720, an ohmic contact of the hybrid electrode can be fabricated to the III-N-type heterostructure. A negative-charge trapped region in the III-N-type heterostructure can be formed, at 2730, via at least one of plasma treatment or ion implantation. At 2740, a Schottky barrier contact of the hybrid electrode can be fabricated to the III-N-type heterostructure over the negative-charge trapped region. In an aspect, thermal annealing of the III-N-type heterostructure can be performed at 2750.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

What is claimed is:

1. A heterostructure semiconductor transistor, comprising:
   a III-N-type semiconductor heterostructure including a barrier layer overlying an active layer; and
   a hybrid drain electrode region including a charge depleted region of a two-dimensional electron gas (2DEG) channel, an ohmic contact, and a first Schottky contact electrode electrically connected to the ohmic contact, wherein the charge depleted region is under negatively charged fluorine (F) ions included under the first Schottky contact electrode.

2. The heterostructure semiconductor transistor of claim 1, wherein the hybrid drain electrode region includes a normally-off section of the 2DEG channel under the first Schottky contact electrode.

3. The heterostructure semiconductor transistor of claim 1, further including a hybrid source electrode region including a normally-on section of the 2DEG channel under a second Schottky contact electrode.

4. The heterostructure semiconductor transistor of claim 1, further including a hybrid gate electrode region including a normally-off section of the 2DEG channel under a second Schottky contact electrode and a normally-on section of the 2DEG channel under a third Schottky contact electrode.

5. The heterostructure semiconductor transistor of claim 1, wherein the hybrid drain electrode region includes trapped charge located under the first Schottky contact electrode.

6. The heterostructure semiconductor transistor of claim 5, wherein the trapped charge includes at least a portion of the negatively charged fluorine ions.

7. The heterostructure semiconductor transistor of claim 5, further comprising:
   an insulator layer of at least one of silicon nitride, $Al_2O_3$, $SiO_2$, or Hafnium Oxide, wherein the insulator layer is located between the first Schottky contact electrode and the III-N-type semiconductor heterostructure.

8. The heterostructure semiconductor transistor of claim 1, wherein the barrier layer is undoped.

9. The heterostructure semiconductor transistor of claim 1, wherein the barrier layer includes at least one of AlGaN or AlGaN capped by GaN.

10. The heterostructure semiconductor transistor of claim 1, wherein the active layer comprises GaN.

11. The heterostructure semiconductor transistor of claim 1, wherein the active layer overlies a III-N buffer layer, which overlies a III-N nucleation layer.

12. The heterostructure semiconductor transistor of claim 1, further comprising:
   a passivation layer including at least one of silicon nitride, oxide, Benzocyclobutene, or polyimide.

13. The heterostructure semiconductor transistor of claim 1, wherein the III-N-type semiconductor heterostructure includes GaN and related ternary semiconductor materials.

14. The heterostructure semiconductor transistor of claim 1, wherein the III-N-type semiconductor heterostructure includes metal nitrides including more than one Group III material.

15. A heterostructure semiconductor rectifier, comprising:
    a III-N-type semiconductor heterostructure including a barrier layer overlying an active layer; and
    a hybrid anode electrode region including a charge depleted region of a two-dimensional electron gas (2DEG) channel, an ohmic contact, and a first Schottky contact electrode electrically connected to the ohmic contact, wherein the charge depleted region is located under negatively charged fluorine (F) ions included under the first Schottky contact electrode.

16. The heterostructure semiconductor rectifier of claim 15, further comprising a hybrid cathode electrode region including a normally-on section of the 2DEG channel under a second Schottky contact electrode.

17. The heterostructure semiconductor rectifier of claim 15, wherein the hybrid anode electrode region includes a normally-off section of the 2DEG channel under the first Schottky contact electrode.

18. The heterostructure semiconductor rectifier of claim 15, wherein the hybrid anode electrode region includes trapped charge located under the first Schottky contact electrode.

19. The heterostructure semiconductor rectifier of claim 18, wherein the trapped charge includes at least a portion of the negatively charged fluorine ions.

20. The heterostructure semiconductor rectifier of claim 15, further comprising:
    an insulator layer of at least one of silicon nitride, $Al_2O_3$, $SiO_2$, or Hafnium Oxide, wherein the insulator layer is located between the first Schottky contact electrode and the III-N-type semiconductor heterostructure.

21. The heterostructure semiconductor rectifier of claim 15, further comprising:
    a second Schottky contact electrode of the hybrid anode electrode region, wherein the second Schottky contact electrode is located above a normally-on 2DEG channel.

22. The heterostructure semiconductor rectifier of claim 21, wherein the second Schottky contact electrode is electrically connected coupled to the first Schottky contact electrode and the ohmic contact of the hybrid anode electrode region.

23. A method for forming a high electron mobility transistor (HEMT) within a III-N-type semiconductor heterostructure;
    incorporating a hybrid drain electrode region into the III-N-type semiconductor heterostructure;
    incorporating negatively charged fluorine (F) ions within the hybrid drain electrode region under a Schottky section of the hybrid drain electrode region;
    creating a charge depleted region of a two-dimensional gas (2DEG) channel below the negatively charged F ions and within the hybrid drain electrode region; and
    electrically connecting the Schottky section to an ohmic section of the hybrid drain electrode region.

24. The method of claim 23, further comprising:
    including a normally-off section of the 2DEG channel under the Schottky section.

25. The method of claim 23, wherein the incorporating the hybrid drain electrode region into the III-N-type semiconductor heterostructure further includes at least one of:
    incorporating a hybrid source electrode region into the III-N-type semiconductor heterostructure, wherein the hybrid source electrode region includes a normally-on section of the 2DEG channel under a Schottky contact electrode; or
    incorporating a hybrid gate electrode region into the III-N-type semiconductor heterostructure, wherein the hybrid gate electrode region includes a normally-off section of the 2DEG channel under a Schottky contact electrode and a normally-on section of the 2DEG channel under another Schottky contact electrode.

26. The method of claim 23, further comprising:
    trapping charge under the Schottky contact.

27. The method of claim 23, further comprising:
    providing reverse drain bias blocking via the hybrid drain electrode region.

28. A method for manufacturing a high electron mobility transistor (HEMT), comprising:
    forming the HEMT within a III-N-type heterostructure including a barrier layer and an active layer;
    including negatively charged fluorine (F) ions in a negatively charged region within a hybrid drain electrode region of the III-N-type heterostructure under a Schottky contact of the hybrid drain electrode region;
    creating an ohmic contact in the hybrid drain electrode region and electrically connecting the ohmic contact to the Schottky contact; and
    creating a charge depleted region of a two-dimensional gas (2DEG) channel under the negatively charged region and within the hybrid drain electrode region.

* * * * *